(12) United States Patent
Matsubara et al.

(10) Patent No.: US 8,742,423 B2
(45) Date of Patent: Jun. 3, 2014

(54) THIN-FILM TRANSISTOR ARRAY AND IMAGE DISPLAY DEVICE IN WHICH THIN-FILM TRANSISTOR ARRAY IS USED

(75) Inventors: Ryohei Matsubara, Tokyo (JP); Mamoru Ishizaki, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 13/232,856

(22) Filed: Sep. 14, 2011

(65) Prior Publication Data
US 2012/0001189 A1     Jan. 5, 2012

Related U.S. Application Data

(63) Continuation of application No. PCT/JP2010/054439, filed on Mar. 16, 2010.

(30) Foreign Application Priority Data

Mar. 17, 2009  (JP) .................................. 2009-063795
Sep. 16, 2009  (JP) .................................. 2009-214224

(51) Int. Cl.
| | | |
|---|---|---|
| H01L 29/04 | (2006.01) | |
| H01L 29/15 | (2006.01) | |
| H01L 27/14 | (2006.01) | |
| H01L 29/423 | (2006.01) | |
| H01L 29/786 | (2006.01) | |
| H01L 29/417 | (2006.01) | |
| H01L 27/12 | (2006.01) | |

(52) U.S. Cl.
CPC .... *H01L 29/42384* (2013.01); *H01L 29/78696* (2013.01); *H01L 29/78618* (2013.01); *H01L 29/41733* (2013.01); *H01L 27/1214* (2013.01)
USPC ... 257/72; 257/57; 257/E29.151; 257/E29.117; 438/149

(58) Field of Classification Search
CPC ................... H01L 29/78696; H01L 29/78618; H01L 29/41733; H01L 27/1214
USPC ........ 257/57, 59, 72, 288, E33.053, E29.151, 257/E51.005, E29.117; 438/30, 149; 349/39, 42, 43, 46, 52
See application file for complete search history.

(56) References Cited

U.S. PATENT DOCUMENTS 5,737,041 A *  4/1998  Holmberg et al. ............... 349/43
6,239,468 B1 * 5/2001  Chang et al. .................. 257/347
(Continued)

FOREIGN PATENT DOCUMENTS

JP    02-234438    9/1990
JP    05-249485    9/1993
(Continued)

OTHER PUBLICATIONS

Translation of International Preliminary Report on Patentability mailed Oct. 27, 2011, and Written Opinion for PCT/JP2010/054439, mailed Apr. 20, 2010, 12 pgs.

(Continued)

*Primary Examiner* — Fernando L Toledo
*Assistant Examiner* — Aaron Gray
(74) *Attorney, Agent, or Firm* — Squire Sanders (US) LLP

(57) ABSTRACT

In a thin-film transistor array according to an embodiment of the present invention, thin-film transistors are disposed in a matrix array, the thin-film transistor including a gate electrode that is formed on a substrate, a gate insulating layer that is formed on the gate electrode, a source electrode that is formed on the gate insulating layer, a pixel electrode that is formed on the gate insulating layer, a drain electrode that is connected to the pixel electrode, and a semiconductor layer that is formed between the source electrode and the drain electrode, the gate electrode is connected to a gate line while the source electrode is connected to a source line, the thin-film transistor is formed within a region of the source line and the thin-film transistor array includes a stripe insulating film such that the source line and the semiconductor layer are covered with the stripe insulating film.

12 Claims, 29 Drawing Sheets

(56) References Cited

U.S. PATENT DOCUMENTS

| | | | | |
|---|---|---|---|---|
| 6,509,946 B1* | 1/2003 | Kodate | | 349/141 |
| 2006/0049404 A1* | 3/2006 | Park et al. | | 257/59 |
| 2008/0030639 A1* | 2/2008 | Qiu et al. | | 349/46 |
| 2008/0111136 A1* | 5/2008 | Qiu et al. | | 257/72 |
| 2008/0197348 A1* | 8/2008 | Matsubara et al. | | 257/40 |
| 2008/0239189 A1* | 10/2008 | Hatta et al. | | 349/46 |

FOREIGN PATENT DOCUMENTS

| | | |
|---|---|---|
| JP | 09-258199 | 10/1997 |
| JP | 09-292633 | 11/1997 |
| JP | 2007-281188 | 10/2007 |
| JP | 2008-147607 | 6/2008 |
| JP | 2008-235861 | 10/2008 |

OTHER PUBLICATIONS

Japanese Notification of Reasons for Refusal dispatched by JPO on Nov. 24, 2010, in connection with Appl. No. 2010-539967, 5 pgs.

Translation of Japanese Notification of Reasons for Refusal dispatched by JPO on Nov. 24, 2010, in connection with Appl. No. 2010-539967, 9 pgs.

* cited by examiner

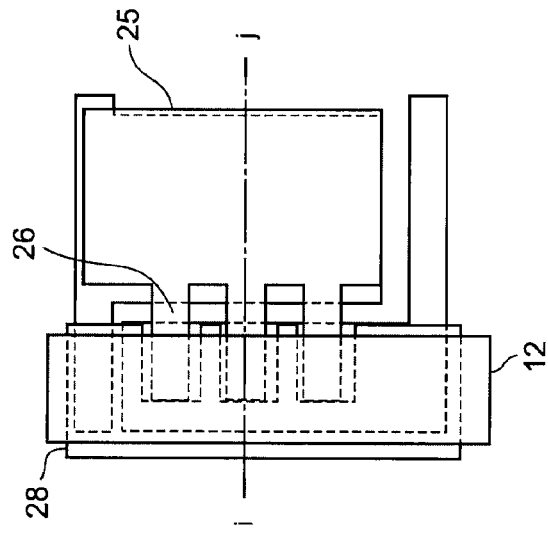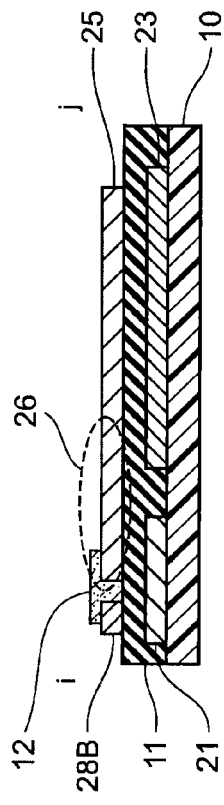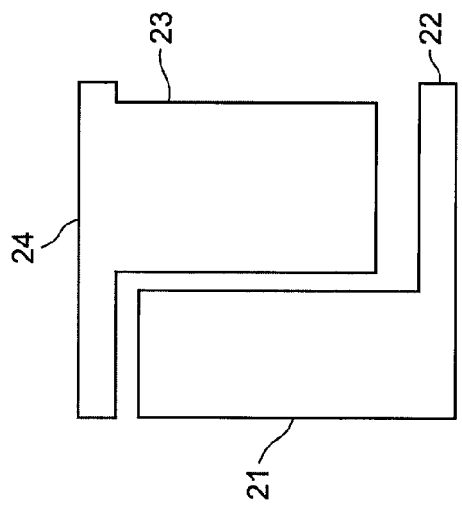

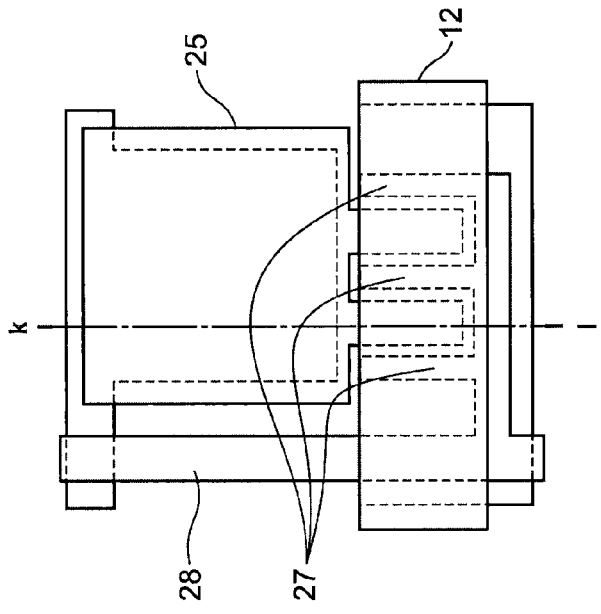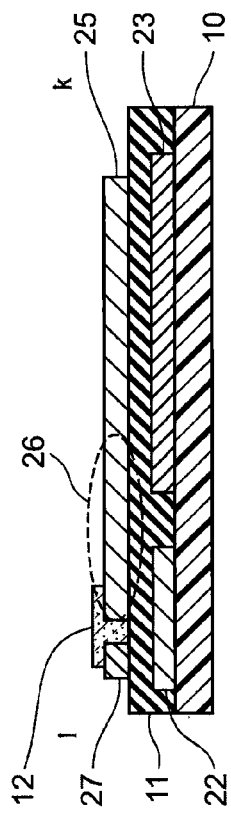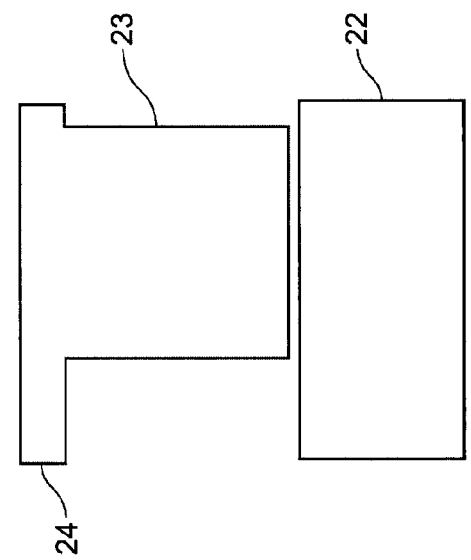

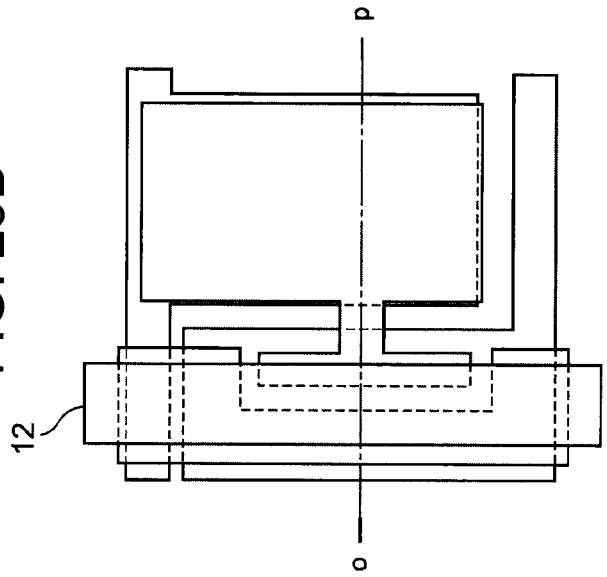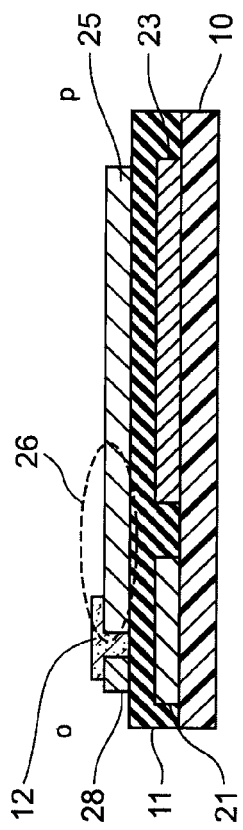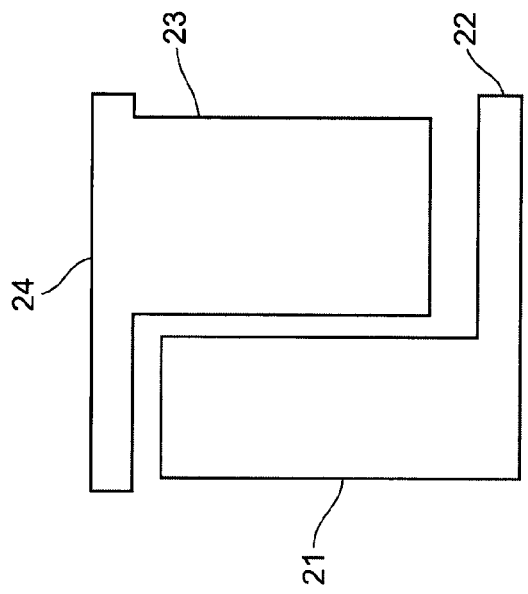

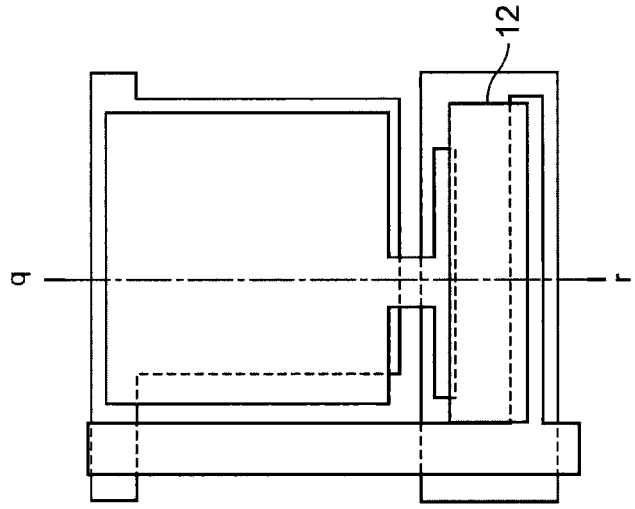
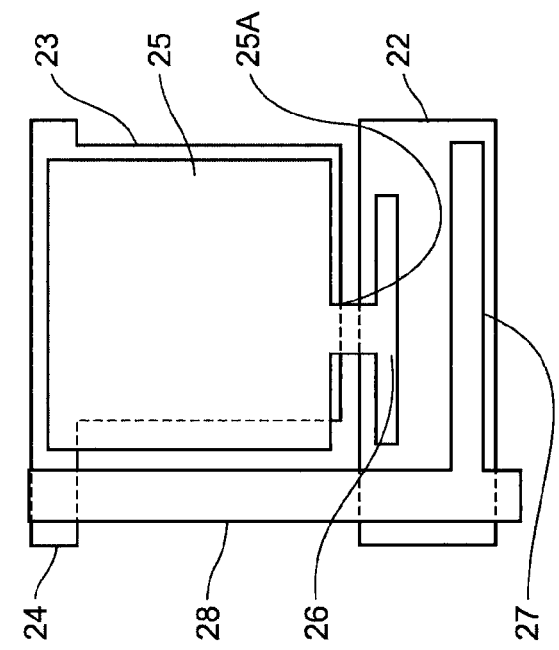
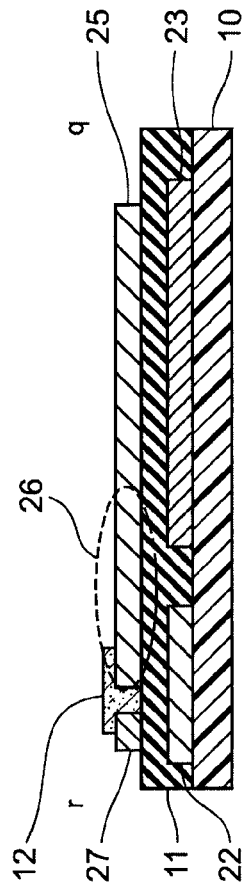

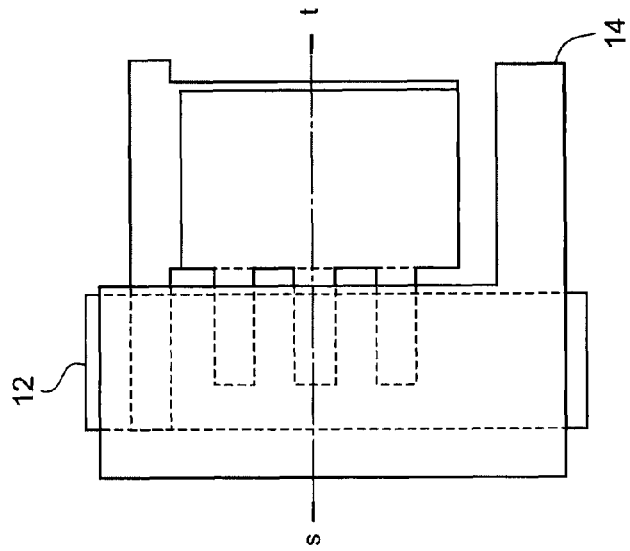
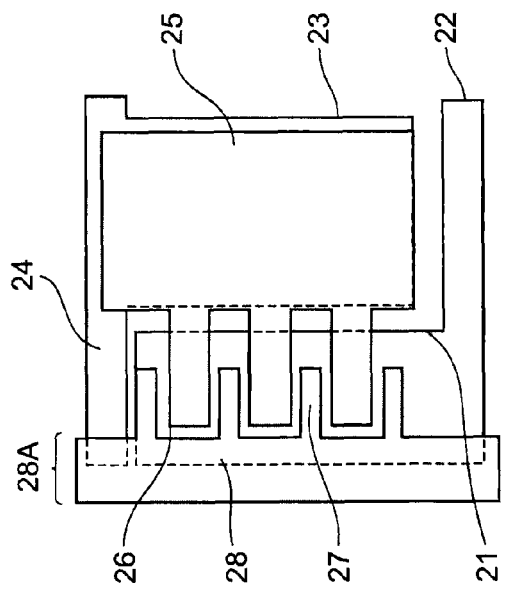
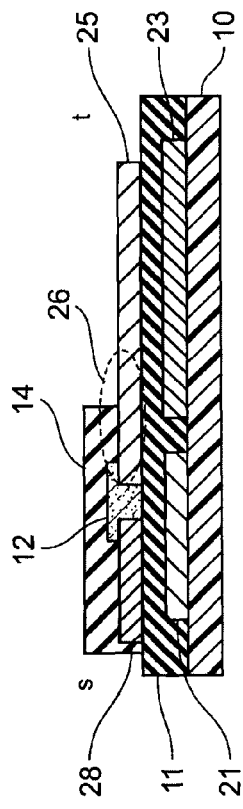

THIN-FILM TRANSISTOR ARRAY AND IMAGE DISPLAY DEVICE IN WHICH THIN-FILM TRANSISTOR ARRAY IS USED

CROSS REFERENCE TO RELATED APPLICATION

This application is a continuation of International Application No. PCT/JP2010/054439, filed on Mar. 16, 2010, the entire contents of which are incorporated herein by reference.

BACKGROUND OF THE INVENTION

1. Field of the Invention

The present invention relates to a thin-film transistor array and an image display device in which the thin-film transistor array is used.

2. Description of the Related Art

With an outstanding progress of an information technology, currently information is frequently transmitted and received with a notebook personal computer or a personal digital assistance. There is well known the fact that a ubiquitous society in which the information can be transmitted and received anywhere comes in the near future. In the ubiquitous society, there is a demand for a lighter, lower-profile information terminal.

Although a current mainstream of a semiconductor material is a silicon system (Si system), a study on a transistor in which an organic semiconductor or an oxide semiconductor is used becomes active from the viewpoint of a flexible information terminal, weight reduction, cost reduction, and the like. Generally, in the case that the organic semiconductor is used, advantages such as enlargement of an area, application of a printing method, and use of a plastic substrate can be cited because a process can be performed in a liquid state (see Non-Patent Literature 1). Some kinds of oxide semiconductors can be deposited at low temperature and exhibit high carrier mobility. For example, there is proposed a field effect transistor that is made of an amorphous In—Ga—Zn—O material as the oxide semiconductor (see Non-Patent Literature 2). In Non-Patent Literature 2, the material of the amorphous oxide semiconductor is used as a semiconductor active layer, whereby a transparent field effect transistor having excellent carrier mobility of about 10 $cm^2$/Vs is successfully fabricated on a PET substrate at room temperature.

However, the carrier mobility of the organic semiconductor is lower than that of amorphous silicon. For example, in the case that a thin-film transistor array that drives a display is made of the organic semiconductor, it is necessary to form a relatively large transistor in order to ensure a current value necessary for drive. Therefore, unfortunately a ratio of the transistor to one pixel increases to decrease an aperture ratio (an area ratio of a display portion to a pixel unit). For example, in an example of a conventional thin-film transistor illustrated in FIGS. 26 and 27, a source electrode 27 extending from a source line 28 and a drain electrode 26 connected to a pixel electrode 25 are formed into a comb shape, and a semiconductor layer 12 is formed between the source electrode 27 and the drain electrode 26. A region of the pixel electrode 25 is narrowed by a thin-film transistor forming region including regions where the source electrode 27 and the drain electrode 26 are formed, and therefore the area ratio (aperture ratio) of the pixel electrode 25 is decreased.

Therefore, there is a method, in which an interlayer insulating film 15 is formed above the thin-film transistor and an upper pixel electrode 29 is formed on the interlayer insulating film 15, thereby increasing the aperture ratio as illustrated in FIGS. 28 and 29.

In the case that the oxide semiconductor is used, although a size of the transistor can be reduced because of the high carrier mobility, the above method is also adopted in order to further increase the aperture ratio.

Non-Patent Literature 1: Science Vol. 265, 1684 (1994)
Non-Patent Literature 2: K. Nomura et al, Nature 432, 488 (2004)

However, in the case that the aperture ratio is improved by the above method, the cost increases with increasing the number of processes.

A screen printing method or a photolithographic method is used as a process of forming the upper pixel electrode 29. However, when the screen printing method or the photolithographic method is used after the semiconductor layer is formed, stabilities of a threshold voltage and the carrier mobility of the thin-film transistor are degraded.

SUMMARY OF THE INVENTION

The present invention provides a high-aperture-ratio, low-cost thin-film transistor array and an image display device in which the thin-film transistor array is used.

A first aspect of the invention is a thin-film transistor array characterized in that thin-film transistors are disposed in a matrix array, the thin-film transistor including a gate electrode that is formed on a substrate, a gate insulating layer that is formed on the gate electrode, a source electrode that is formed on the gate insulating layer, a pixel electrode that is formed on the gate insulating layer, a drain electrode that is connected to the pixel electrode, and a semiconductor layer that is formed between the source electrode and the drain electrode, the gate electrode is connected to a gate line while the source electrode is connected to a source line, the thin-film transistor is formed within a region of the source line and the thin-film transistor array includes a stripe insulating film that covers the source line and the semiconductor layer.

A second aspect of the invention is the thin-film transistor array according to the first aspect characterized in that the source line includes a notch in part thereof, the drain electrode is formed in the notch, and the source line doubles as the source electrode.

A third aspect of the invention is the thin-film transistor array according to the second aspect characterized in that the drain electrode is formed into a comb type in which the drain electrode invades in the notch of the source line.

A fourth aspect of the invention is the thin-film transistor array according to the second aspect characterized in that the drain electrode has a linear shape along a substantial center line in the source line region, the source line is formed so as to double as the source electrode, and the source electrode has a shape in which the source electrode substantially surrounds the drain electrode.

A fifth aspect of the invention is the thin-film transistor array according to the second aspect characterized in that the notch of the source line has a rectangular shape and the drain electrode has a shape that corresponds with the rectangular shape of the notch, there being a gap between the source line and the drain electrode, the gap disposed at a substantial center line in the source line region.

A sixth aspect of the invention is the thin-film transistor array according to the first aspect characterized in that the semiconductor layer has a linear shape along a substantial center line in the source line region.

A seventh aspect of the invention is the thin-film transistor array according to the sixth aspect characterized in that the semiconductor layer has a stripe shape in which the semiconductor layer is parallel to the source line and continuously formed in a plurality of pixels.

An eighth aspect of the invention is the thin-film transistor array according to the first aspect characterized in that the semiconductor layer is made of an organic semiconductor or an oxide semiconductor.

A ninth aspect of the invention is the thin-film transistor array according to the first aspect characterized in that the thin-film transistor array includes a capacitor electrode in a layer where the gate electrode is formed.

A tenth aspect of the invention is an image display device characterized in that the thin-film transistor array according to the first aspect is used.

According to the invention, there is provided the high-aperture-ratio, low-cost thin-film transistor array and the image display device in which the thin-film transistor array is used.

BRIEF DESCRIPTION OF THE DRAWINGS

FIG. 17(a) is a schematic diagram illustrating one pixel of the thin-film transistor array illustrated in FIG. 16 in a midstream production process, FIG. 17(b) is a schematic diagram illustrating the one pixel of the thin-film transistor array illustrated in FIG. 16, and FIG. 17(c) is a schematic sectional view taken on a line i-j illustrated in FIG. 17(b).

FIG. 19(a) is a schematic diagram illustrating one pixel of the thin-film transistor array illustrated in FIG. 18 in a midstream production process, FIG. 19(b) is a schematic diagram illustrating one pixel of the thin-film transistor array illustrated in FIG. 18, and FIG. 19(c) is a schematic sectional view taken on a line k-l illustrated in FIG. 19(b).

FIG. 23(a) is a schematic diagram illustrating one pixel of the thin-film transistor array illustrated in FIG. 22 in a midstream production process, FIG. 23(b) is a schematic diagram illustrating the one pixel of the thin-film transistor array illustrated in FIG. 22, and FIG. 23(c) is a schematic sectional view taken on a line o-p illustrated in FIG. 23(b).

FIG. 25(a) is a schematic diagram illustrating one pixel of the thin-film transistor array illustrated in FIG. 24 in a midstream production process, FIG. 25(b) is a schematic diagram illustrating the one pixel of the thin-film transistor array illustrated in FIG. 24, and FIG. 25(c) is a schematic sectional view taken on a line q-r illustrated in FIG. 25(b).

FIG. 27(a) is a schematic diagram illustrating one pixel of the thin-film transistor array illustrated in FIG. 26 in a midstream production process, FIG. 27(b) is a schematic diagram illustrating the one pixel of the thin-film transistor array illustrated in FIG. 26, and FIG. 27(c) is a schematic sectional view taken on a line s-t illustrated in FIG. 27(b).

Figure 1:
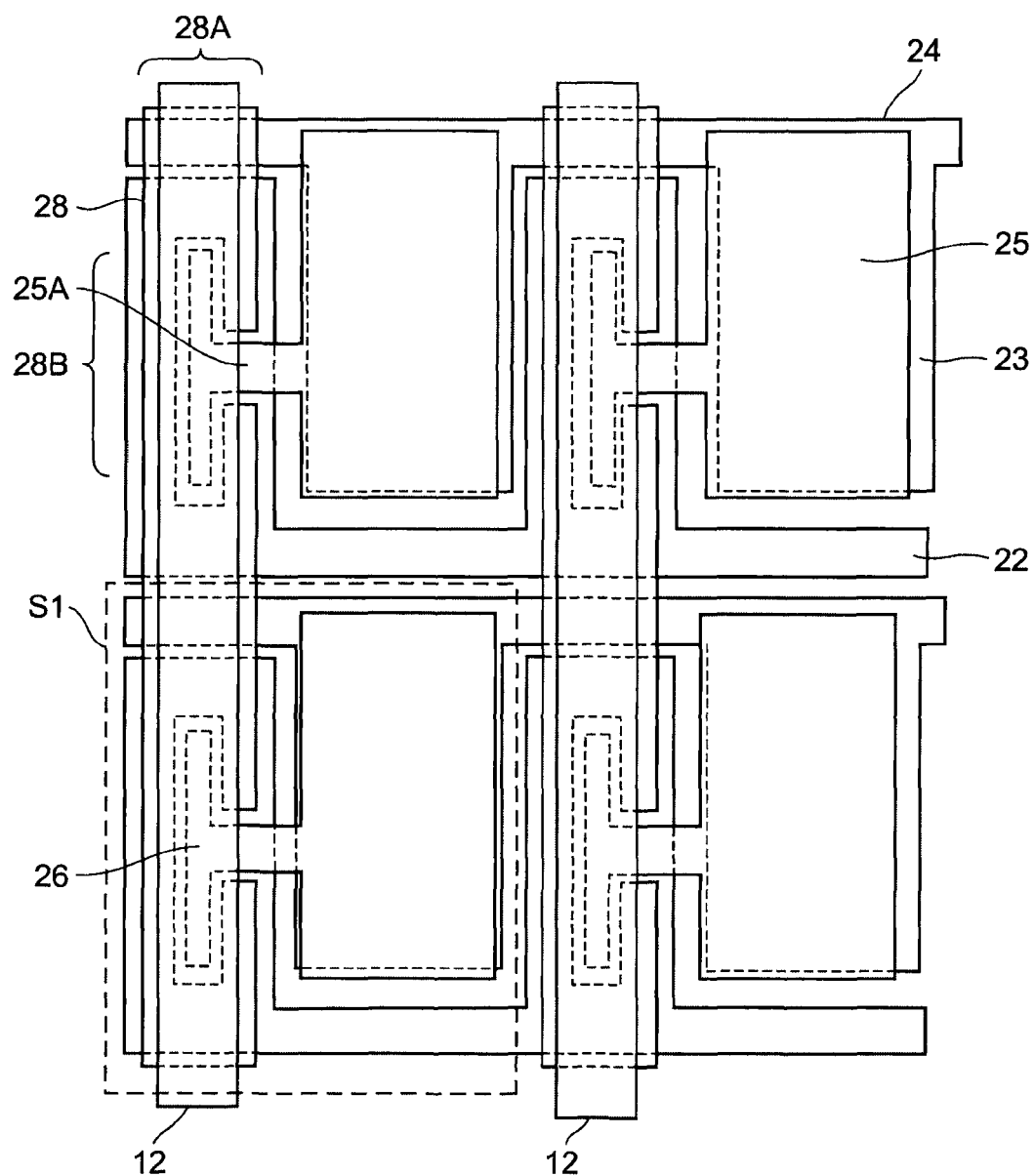
FIG. 1 is a schematic diagram illustrating an example of a thin-film transistor array according to an embodiment of the invention.

10 Substrate
11 Gate insulating film
12 Semiconductor layer
13 Stripe insulating film
14 Grid-like insulating film
15 Interlayer insulating film
21 Gate electrode
22 Gate line
23 Capacitor electrode
24 Capacitor line
25 Pixel electrode
25A Connection electrode
26 Drain electrode
27 Source electrode
28 Source line
28A Source line region
28B Source electrode equivalent region in source line
29 Upper pixel electrode
S1 Region of one pixel
S2 Thin-film transistor region
S3 Pixel electrode region
30 Display medium
31 Counter electrode

DETAILED DESCRIPTION OF THE PREFERRED EMBODIMENTS

Hereinafter, embodiments of the present invention will be described with reference to the drawings. In the embodiments, the same constituent is designated by the same numeral, and the overlapping description is omitted.

Figure 10:
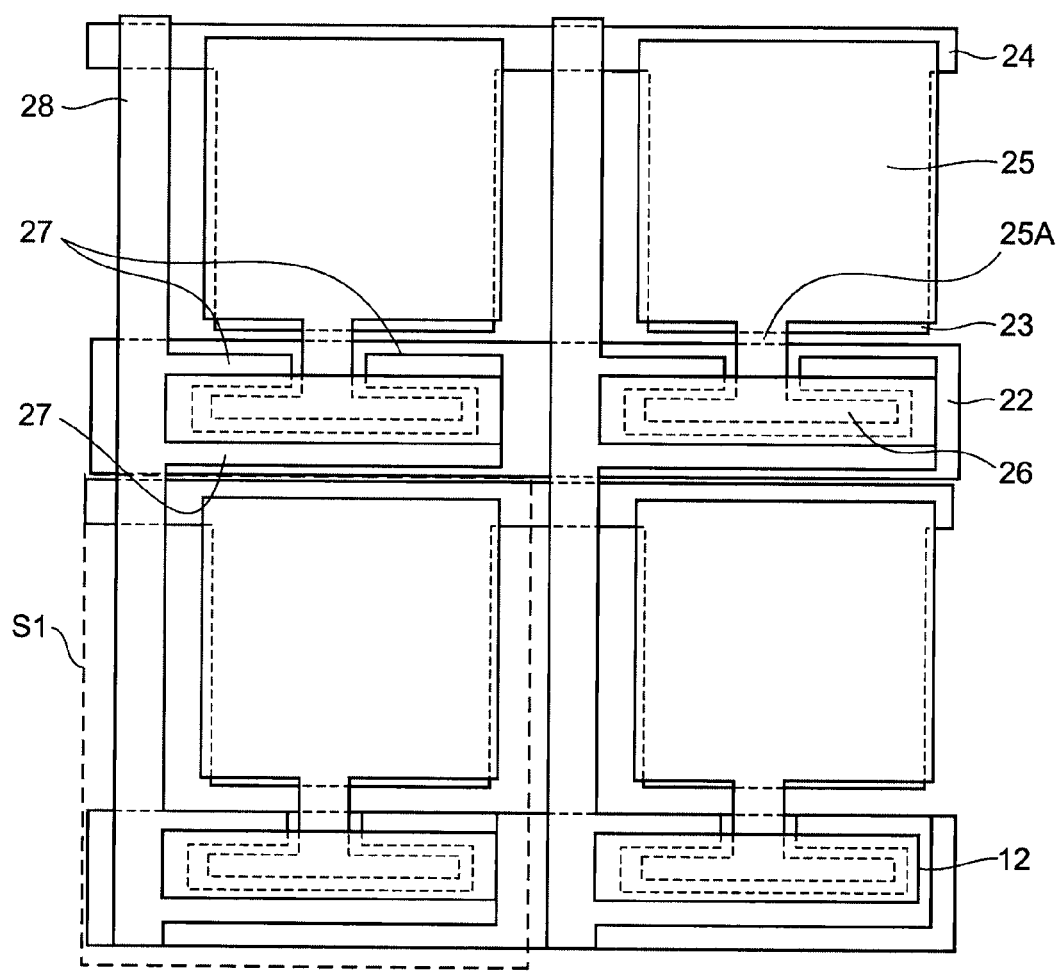
FIG. 10 is a schematic diagram illustrating an example of a thin-film transistor array according to an embodiment of the invention.

For example, as illustrated in FIG. 1 or FIG. 10, in a thin-film transistor array according to an embodiment of the invention, thin-film transistors are disposed in a matrix array, and each thin-film transistor includes agate electrode 21 that is formed on a substrate 10, a gate insulating layer 11 that is formed on the gate electrode 21, a source electrode 27 that is formed on the gate insulating layer 11, a pixel electrode 25 that is formed on the gate insulating layer 11, a drain electrode 26 that is connected to the pixel electrode 25, and a semiconductor layer 12 that is formed between the source electrode 27 and the drain electrode 26. The gate electrode 21 is connected to a gate line 22 while the source electrode 27 is connected to a source line 28, and the gate line 22 and the source line 28 are disposed so as to be orthogonal to each other, thereby connecting the thin-film transistors in the matrix array. Desirably a channel and the drain electrode 26 of the thin-film transistor of the invention are formed within a region of the source line 28 or the gate line 22 of the thin-film transistor array. A structure of the thin-film transistor of the embodiment of the invention is not particularly limited to a bottom-gate, bottom-contact type illustrated in each drawing, but the thin-film transistor of the embodiment of the invention can be used in all the structures such as a bottom-gate, top-contact type and a top-gate, bottom-contact type.

In the case that the channel is formed within the region of the fixed-width stripe source line 28 (FIG. 1: first embodiment), the gate electrode 21 is branched from the gate line 22 and overlap a channel region. The drain electrode 26 is disposed in a notch within the region of the source line 28, thereby forming the channel between the source electrode 27 and the drain electrode 26. That is, the notch is provided in part of the source line 28, and the drain electrode 26 is formed in the notch. Because the part of the source line 28 constitutes the source electrode 27, the channel can be formed in a source line region 28A to widely ensure the region of the pixel electrode 25 connected to the drain electrode 26. Therefore, the high-aperture-ratio thin-film transistor array can be fabricated.

On the other hand, in the case that the channel is formed within the region of the fixed-width stripe gate line 22 (FIG. 10: second embodiment), the source electrode 27 is branched from the source line 28 and brought close to the drain electrode 26 within the region of gate line 22 (and the gate electrode 21). Therefore, the high-aperture-ratio thin-film transistor array can be fabricated with no use of an upper pixel electrode. The thin-film transistor arrays according to the embodiments of the invention will be described in detail with reference to the drawings.

First, a first embodiment of the invention will be described below.

Figure 2A:
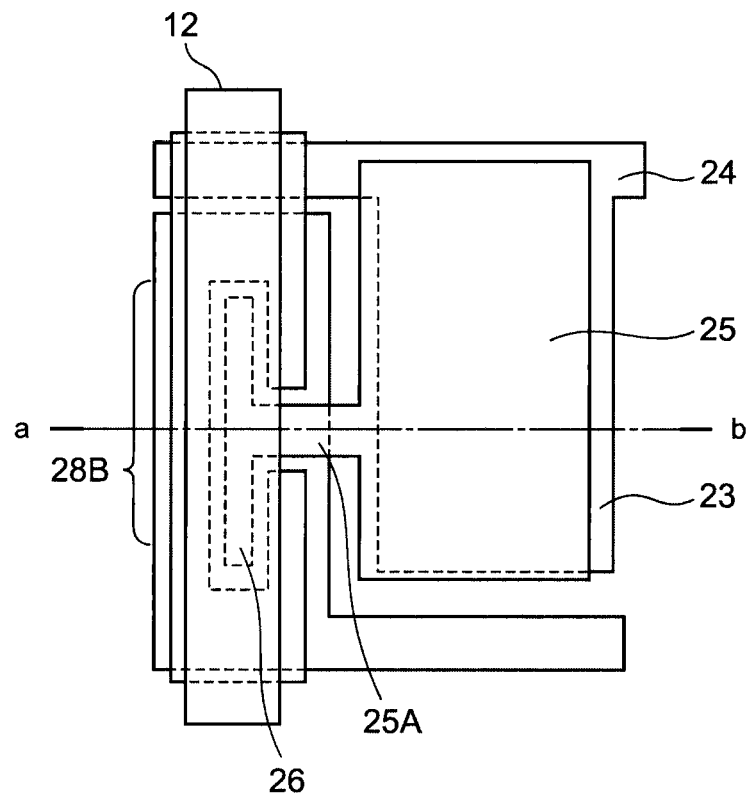
FIG. 2(a) is a schematic diagram illustrating one pixel of the thin-film transistor array illustrated in FIG. 1.
Figure 2B:
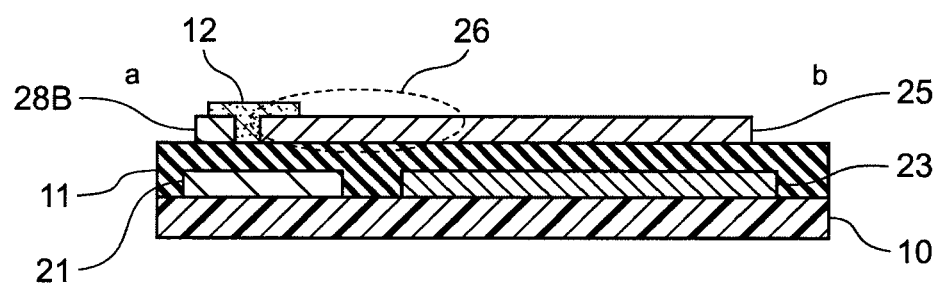
FIG. 2(b) is a schematic sectional view taken on a line a-b illustrated in FIG. 2(a).

FIG. 1 is a schematic diagram illustrating the thin-film transistor array according to the embodiment of the invention. FIG. 2(a) is a schematic diagram illustrating one pixel (S1 region) of the thin-film transistor array illustrated in FIG. 1, and FIG. 2(b) is a schematic sectional view taken on a line a-b illustrated in FIG. 2(a). Referring to FIG. 1, in the semiconductor layers 12 of the thin-film transistors in the left column, only a boundary line is illustrated by a solid line. In the drawings from FIG. 2, only the boundary line or part of the semiconductor layer is illustrated by hatching unless otherwise noted. As illustrated in FIGS. 1 and 2, in the thin-film transistor array according to the embodiment of the invention, the thin-film transistors are disposed in the matrix array, and each thin-film transistor includes the gate electrode 21 that is formed on the substrate 10, the gate insulating layer 11 that is formed on the gate electrode 21, the source electrode 27 that is formed on the gate insulating layer 11, the pixel electrode 25 that is formed on the gate insulating layer 11, the drain electrode 26 that is connected to the pixel electrode 25, and the semiconductor layer 12 that is formed between the source electrode 27 and the drain electrode 26. In each thin-film transistor, the gate electrode 21 is connected to the gate line 22 while the source electrode 27 is connected to the source line 28, and the drain electrode 26 is formed in the source line region 28A.

In the first embodiment of the invention, the channel can be formed in the source line region 28A by a source electrode equivalent region 28B in which the notch corresponding to a shape of the drain electrode 26 is provided in the source line 28. Because the region of the pixel electrode 25 connected to the drain electrode 26 can widely be ensured, the high-aperture-ratio thin-film transistor array can be fabricated.

As illustrated in FIG. 2 (a), the thin-film transistor array of FIG. 1 has a structure in which the drain electrode 26 is substantially surrounded by the source electrode equivalent region 28B of the source line, and the drain electrode 26 has a linear shape along a center line of the source line region 28A. A connection electrode 25A connected to the pixel electrode 25 is connected to a substantial center of the drain electrode 26. As used herein, the connection electrode 25A means a portion that is not opposite the source electrode equivalent region 28B of the source line in an electrode region projected from the pixel electrode 25. Although the drain electrode 26 is illustrated as a rectangle, both ends of the drain electrode 26 may be rounded. Therefore, the thin-film transistor can be formed in the source line region 28A, and the source line region 28A can be maintained relatively thin.

Figure 3E:
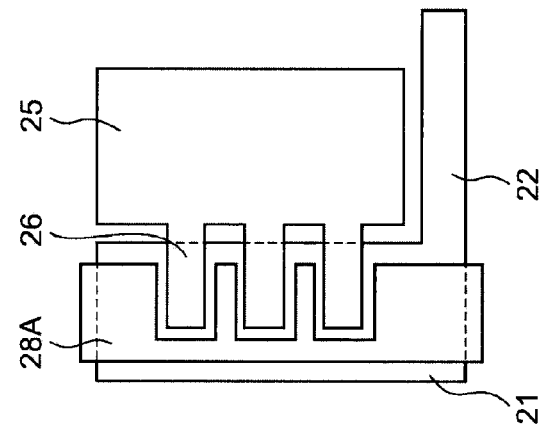
FIG. 3 is a schematic diagram illustrating a configuration example of a source electrode equivalent region and a drain electrode of a thin-film transistor array according to an embodiment of the invention.
Figure 3C:
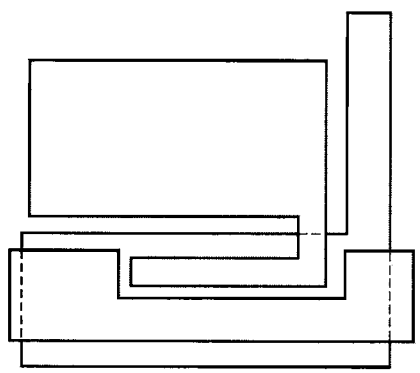
Figure 3D:
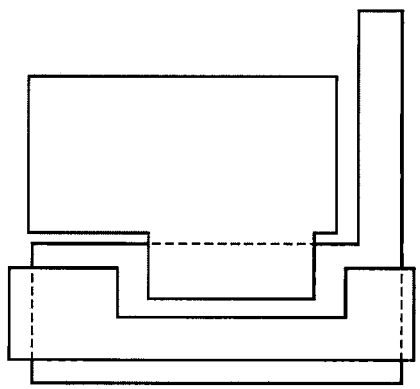
Figure 3A:
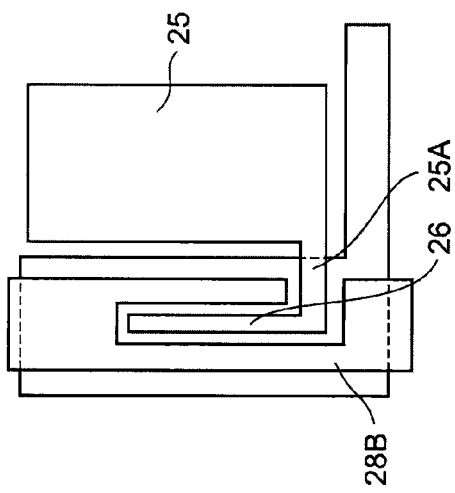

FIGS. 3(a) to 3(e) illustrate other configuration examples of the source electrode equivalent region 28B and the drain electrode 26 of the thin-film transistor array according to the first embodiment of the invention. In FIGS. 3(a) to 3(e), other constituents except the source line 28 (source electrode equivalent region 28B), the drain electrode 26, the pixel electrode 25, the connection electrode 25A, the gate electrode 21, and the gate line 22 for one pixel are omitted. In FIG. 2(a), the connection electrode 25A has a T-shape in which the connection electrode 25A is connected to the substantial center of the drain electrode 26. Alternatively, as illustrated in FIG. 3(a), the connection electrode 25A may have an L-shape in which the connection electrode 25A is connected to an end portion of the drain electrode.

Figure 3B:
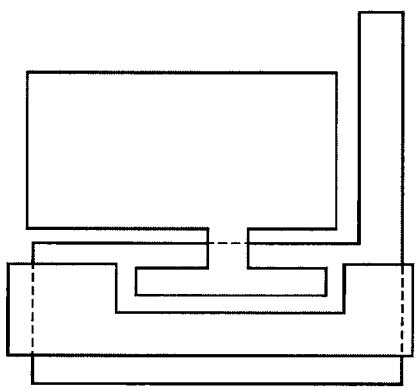

As illustrated in FIG. 3(b), a rectangular notch is provided in the source line 28, and the drain electrode 26 may have a shape in which the drain electrode 26 is opposite a portion except the rectangular notch with a substantial center line in the source line region 28A as a gap. The source line 28 doubles as the source electrode 27. The configuration of FIG. 3(b) differs from the configuration of FIG. 2(a) in that the drain electrode 26 is not surrounded by the source electrode 27. The connection electrode 25A connected to the pixel electrode 25 is connected to the substantial center of the drain electrode 26. Although the drain electrode 26 is illustrated as the rectangle, both the ends of the drain electrode 26 may be rounded. Therefore, the thin-film transistor can be formed in the source line 28, and the source line 28 can be maintained relatively thin. In FIG. 3(b), the connection electrode 25A has the T-shape in which the connection electrode 25A is connected to the substantial center of the drain electrode 26. Alternatively, as illustrated in FIG. 3(c), the connection electrode 25A may have the L-shape in which the connection electrode 25A is connected to an end portion of the drain electrode. In the shapes of FIGS. 3(b) and 3(c), the aperture ratio of the pixel can be increased because overlapping between the gate electrode 21 and the drain electrode 26, the connection electrode 25A, and the pixel electrode 25 can be reduced, and the source line can easily be made because the source line has the simple notch shape.

As illustrated in FIG. 3(d), the rectangular notch is provided in the source line 28, and the rectangular drain electrode 26 may have a shape in which the drain electrode 26 is opposite a portion except the rectangular notch with the substantial center line in the source line region 28A as a gap. The configuration of FIG. 3(d) corresponds to the case in which a width of the connection electrode 25A in the configuration of FIG. 3(b) or 3(c) is equal to a length of the drain electrode 26. As used herein, the width of the connection electrode 25A means a width in a vertical direction (a direction orthogonal to a direction connecting the drain electrode 26 and the pixel electrode 25) of the connection electrode 25A in FIG. 3(b), and the length of the drain electrode 26 means a width in a vertical direction (a source line direction of the first embodiment of the invention) of the drain electrode in FIG. 5. In the shape of FIG. 3(d), although the overlapping between the gate electrode 21 and the drain electrode 26 and the pixel electrode 2 is somewhat large, the notch shape of the source line and the shapes of the drain electrode 26 and the connection electrode 25A are easily made because of the simple shapes thereof.

As illustrated in FIG. 3(e), the drain electrode 26 has a comb shape, and plural notches corresponding to the comb of the drain electrode may be provided. The drain electrode 26 is formed into the comb shape in which the drain electrode 26 reaches the substantial center line within the region of the source line 28. Although each tooth of the comb-shaped drain electrode 26 is illustrated as the rectangle in FIG. 3(e), both ends of the drain electrode 26 may be rounded. Therefore, the thin-film transistor can be formed within the region of the source line 28, and the source line 28 can be maintained relatively thin. Additionally, the channel width can be increased by increasing the number of teeth of the comb-shaped drain electrode.

In the thin-film transistor array according to the first embodiment of the invention, it is necessary that pattern of the semiconductor layer 12 be formed such that at least the channel region where the source electrode equivalent region 28B of the source line is opposite the drain electrode 26 is covered with the semiconductor layer 12 and such that the semiconductor layer 12 is not in contact with the pixel electrode 12. Accordingly, in the thin-film transistor array according to the first embodiment of the invention in which the channel is formed in the source line region 28A, it is efficient and desirable that the semiconductor layer 12 is formed into the linear shape along the substantial center line of the source line region 28A.

Figure 4:
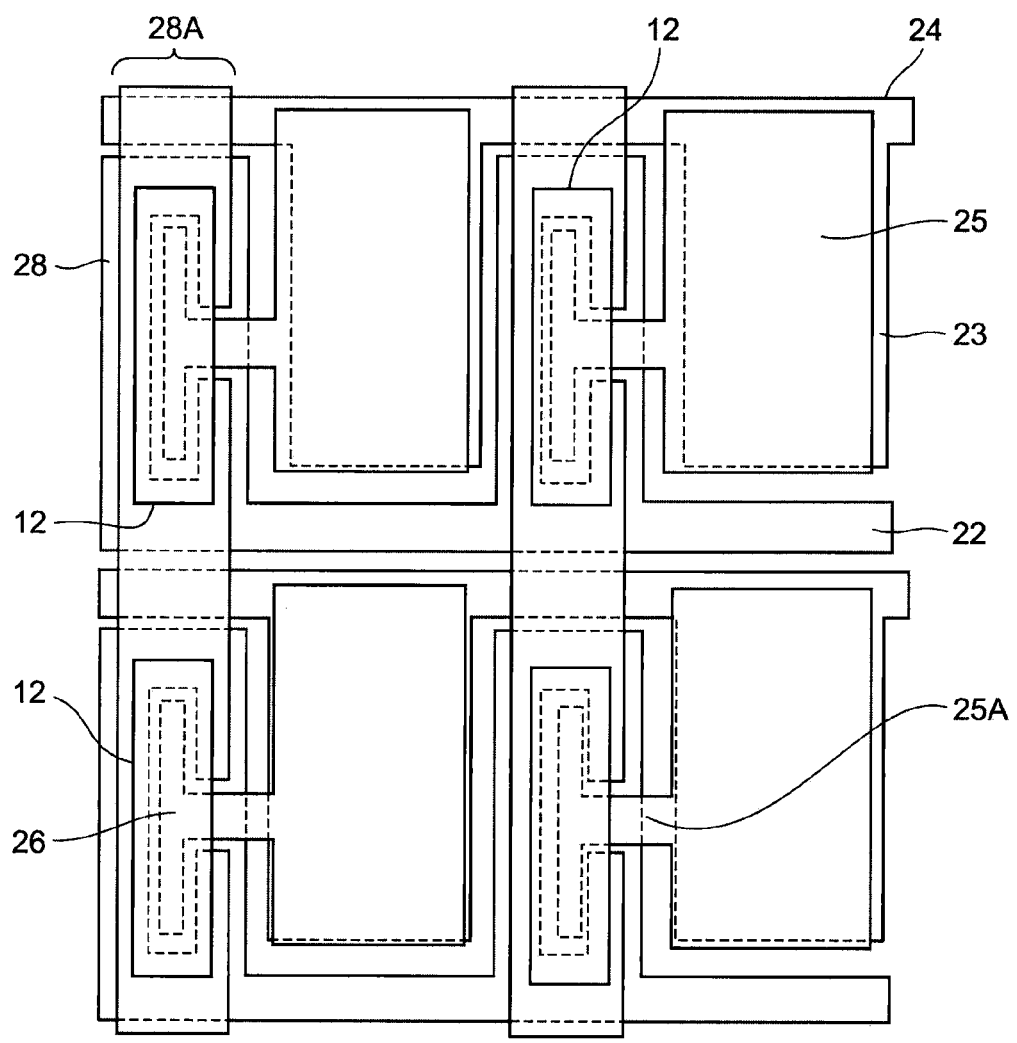
FIG. 4 is a schematic diagram illustrating an example of a thin-film transistor array according to an embodiment of the invention.

When the semiconductor layer 12 is independently formed into the linear shape in each thin-film transistor as illustrated in FIG. 4, the used amount of semiconductor layer material can be reduced in the case that the pattern is selectively formed like various printing methods. However, in consideration of the ease of production, desirably the semiconductor layer 12 has the stripe shape in which the semiconductor layer is parallel to the source line and continuously formed in plural pixels. Therefore, in the case that the semiconductor layer 12 is formed by the printing method or like, the element having higher accuracy of alignment and a smaller variation among elements can be made compared with a dot pattern or a rectangular pattern.

In the embodiments of the invention, desirably the thin-film transistor array includes the capacitor electrode 23 in the same layer as the gate electrode 21. Therefore, charges can stably be retained without relying solely on a capacitance of a display medium, and the image display device is effectively driven. Usually the capacitor electrode 23 is connected to the capacitor line 24 like the configuration of FIG. 1.

Figure 5A:
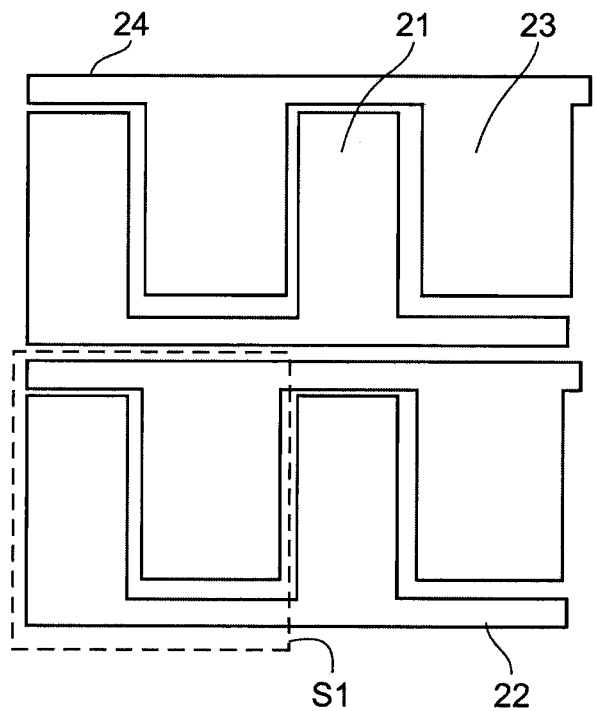
FIG. 5 is a schematic diagram illustrating a configuration example of a gate and a capacitor of a thin-film transistor array according to an embodiment of the invention.
Figure 5B:
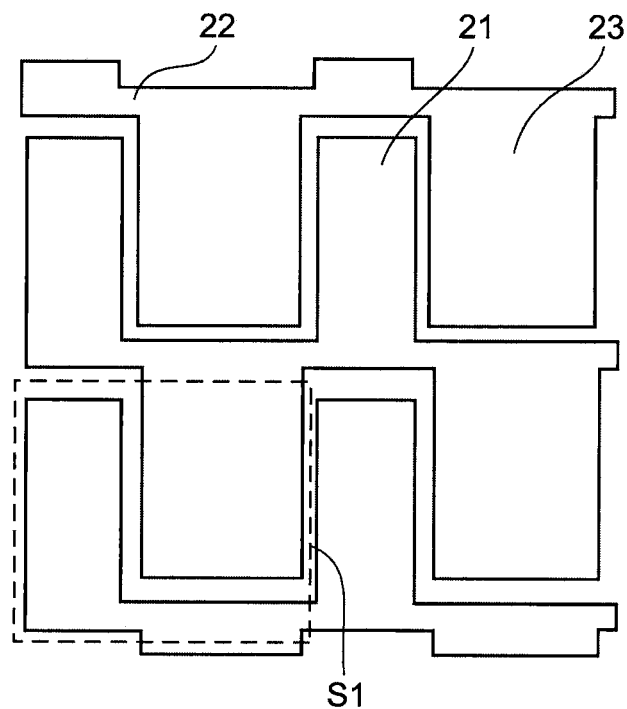

Alternatively, the capacitor electrode 23 may be connected to the gate line 22 of the adjacent row without the capacitor line. FIGS. 5(a) and 5(b) illustrate a disposition of the capacitor electrode in the layer in which the gate electrode 21 is formed. The gate electrode 21 is disposed so as to overlap the channel region, and the capacitor electrode 23 is disposed so as to overlap the pixel electrode region. Referring to FIG. 5(a), the gate line 22 and the capacitor line 24 are formed in parallel to each other, and the gate electrode 21 and the capacitor electrode 23 are connected to the gate line 22 and the capacitor line 24, respectively. Referring to FIG. 5(b), the gate line 22 of the upper row is provided within the region of the lower row, and the capacitor electrode 23 of the lower row is also connected to the region of the lower row. Accordingly, the gate line 22 can overlap the adjacent pixel electrode 25 to enlarge the pixel electrode 25.

In the thin-film transistor array according to the embodiments of the invention, desirably the semiconductor layer is covered with the insulating film in order to prevent the degradation of the semiconductor layer 12.

Figure 6:
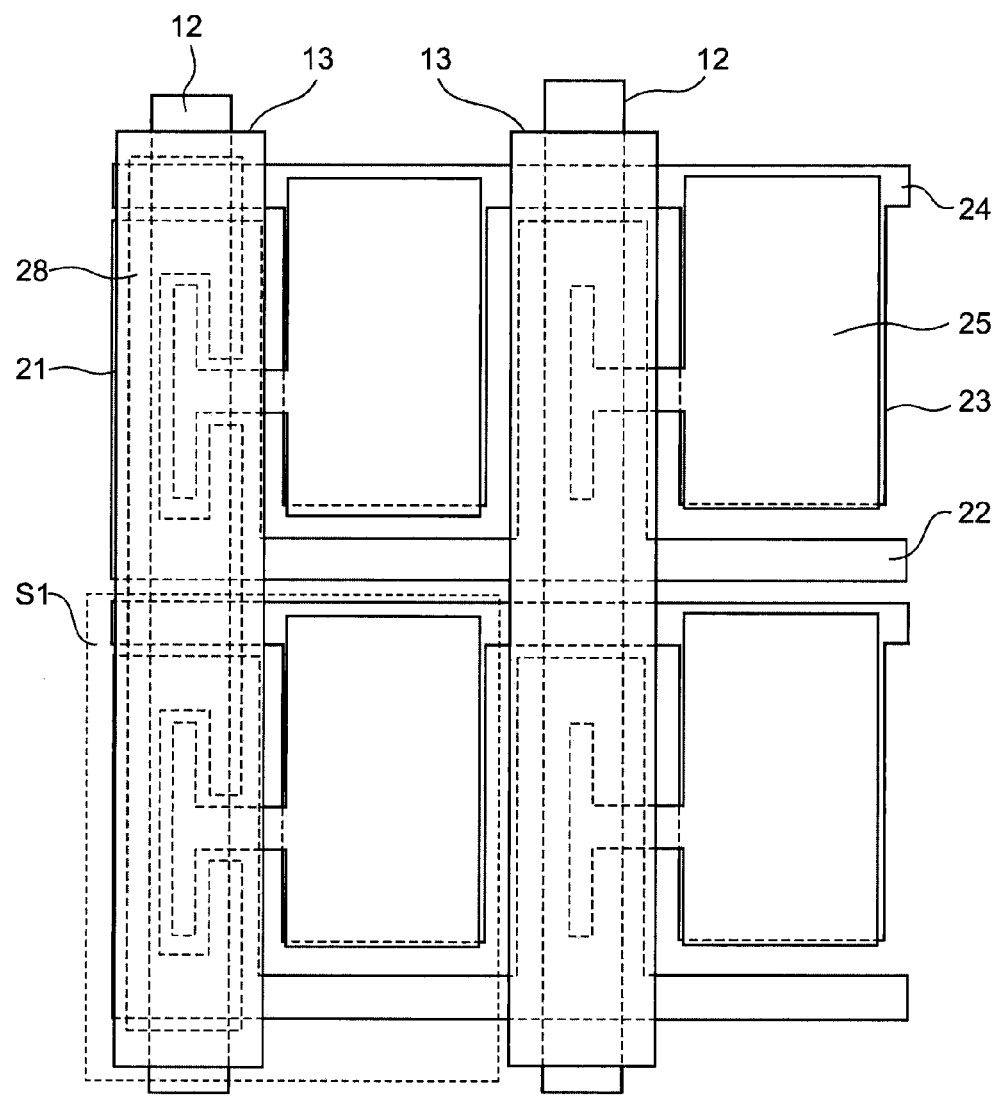
FIG. 6 is a schematic diagram illustrating an example of a thin-film transistor array according to an embodiment of the invention.
Figure 7A:
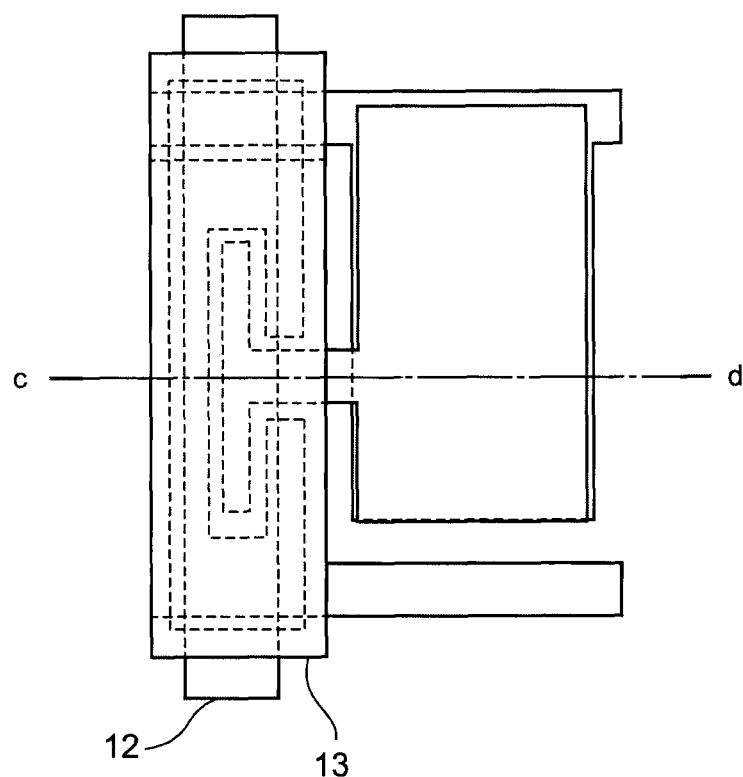
FIG. 7(a) is a schematic diagram illustrating one pixel of the thin-film transistor array illustrated in FIG. 6.
Figure 7B:
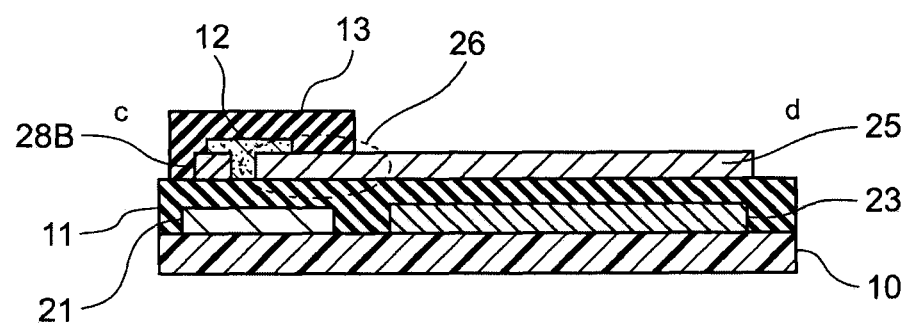
FIG. 7(b) is a schematic sectional view taken on a line c-d illustrated in FIG. 7(a).

FIG. 6 is a schematic diagram illustrating the thin-film transistor array according to the first embodiment of the invention in which a stripe insulating film 13 is formed as the insulating film. FIG. 7(a) is a schematic diagram illustrating one pixel (S1 region) of the thin-film transistor array illustrated in FIG. 6, and FIG. 7(b) is a schematic sectional view taken on a line c-d illustrated in FIG. 7(a). Only part of the insulating film is illustrated by hatching, and only the boundary line is illustrated by a bold sold line for others. In FIG. 7, only the boundary region is illustrated by a solid line for the semiconductor layer 12 of the thin-film transistor of the left column. According to the thin-film transistor array of the invention in the configuration of FIGS. 6 and 7, because the source line 28 is covered with the semiconductor layer 12 at the same time as the source line 28 is covered with the stripe insulating film 13, the degradation of the semiconductor layer 12 can be prevented, and an influence of the voltage at the source line 28 can be suppressed in the case that the image display device is driven. In the case that the semiconductor layer 12 is formed out of the region of the source line 28 or the gate line 22 as in the past, the stripe insulating film having a width in which the widths of the source line and the semiconductor layer are added is required to simultaneously cover the source line and the semiconductor layer with the insulating film. In the invention, the semiconductor layer 12 can simultaneously be covered when only the source line region 28A is covered, so that the aperture ratio can be increased than ever before.

Figure 8:
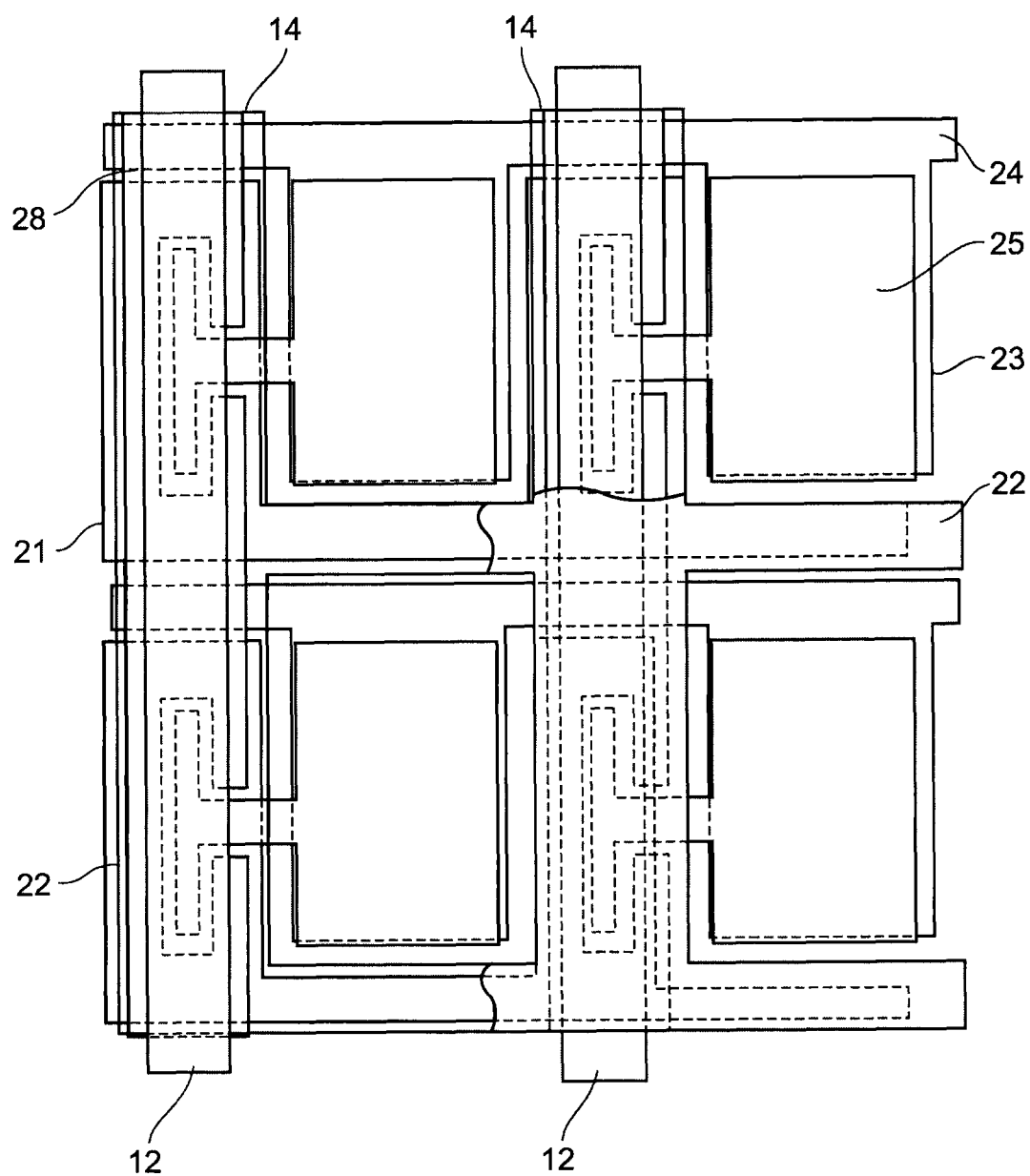
FIG. 8 is a schematic diagram illustrating an example of a thin-film transistor array according to an embodiment of the invention.

FIG. 8 is a schematic diagram illustrating the thin-film transistor array according to the first embodiment of the invention in which a grid-like insulating film 14 covering the source line 28 and the gate line 22 is formed as the insulating film. Therefore, because the source line 28 is covered with the semiconductor layer 12 at the same time as the source line 28 is covered with the stripe insulating film 13, the degradation of the semiconductor layer 12 can be prevented, and the influences of the voltages at the source line 28 and the gate line 22 can be suppressed in the case that the image display device is driven.

Figure 9:
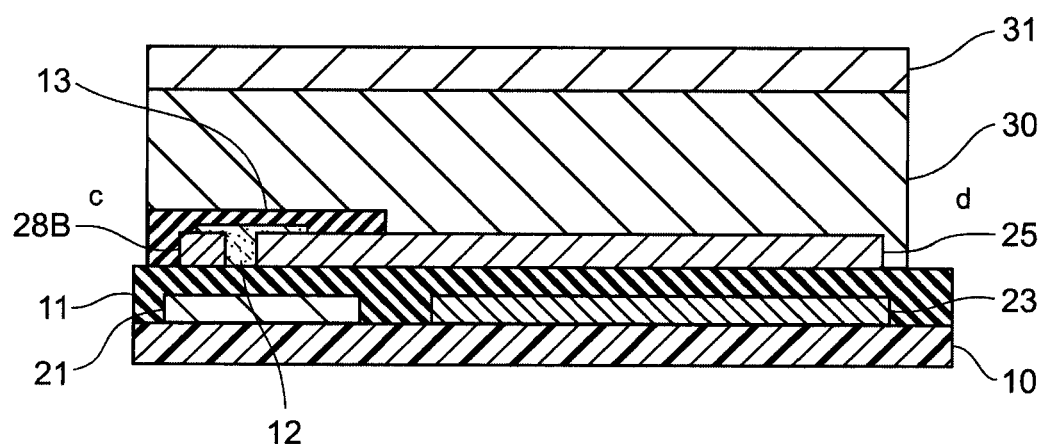
FIG. 9 is a schematic sectional diagram illustrating an example of an image display device according to an embodiment of the invention.

FIG. 9 illustrates an example of an image display device in which the thin-film transistor array illustrated in FIGS. 6 and 7 is used. Referring to FIG. 9, a display medium 30 and a counter electrode 31 are disposed as a front plate on the thin-film transistor array. The display medium 30 is sandwiched between the pixel electrode 26 and the counter electrode 31, and can be driven by applying the voltage between both the electrodes. There is no particular limitation to a kind of the display medium used in the front plate of the image display device of the invention. For example, an electrophoretic display medium, a liquid crystal display medium, and an organic electroluminescence (EL) display medium can be used as the display medium. That is, image display devices such as an electrophoretic display, a liquid crystal display, and an organic electroluminescence (EL) display can be fabricated.

In the first embodiment of the invention, the thin-film transistor array according to the embodiment of the invention can be configured by any combination of the above constituents.

Next, a second embodiment of the invention will be described below.

Figure 11B:
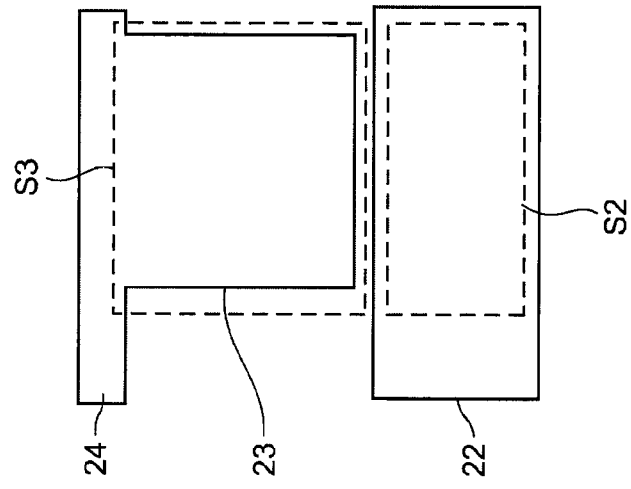
FIG. 11(b) is a schematic diagram illustrating the one pixel of the thin-film transistor array illustrated in FIG. 10.
Figure 11A:
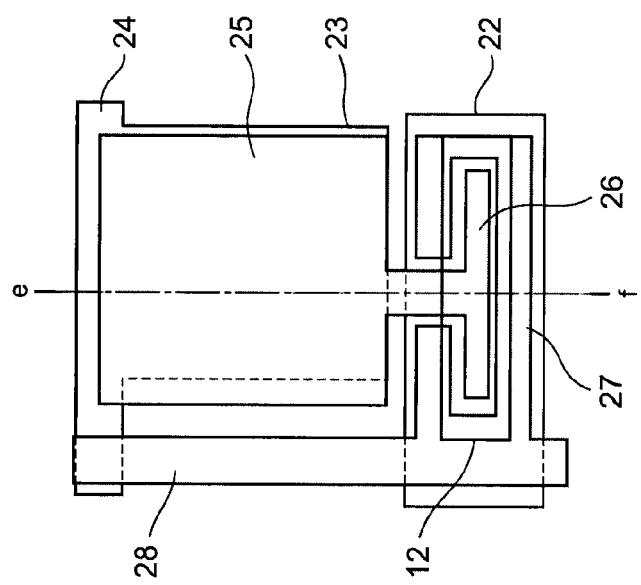
FIG. 11(a) is a schematic diagram illustrating one pixel of the thin-film transistor array illustrated in FIG. 10 in a midstream production process.
Figure 11C:
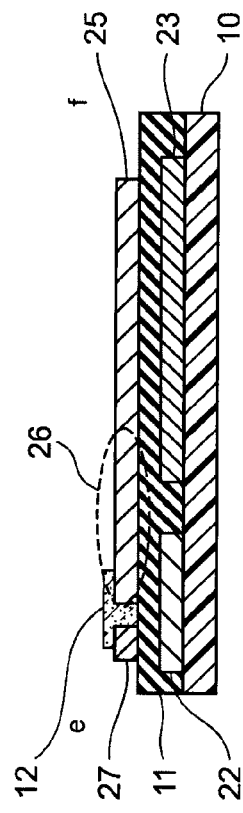
FIG. 11(c) is a schematic sectional view taken on a line e-f illustrated in FIG. 11(b).

FIG. 10 is a schematic diagram illustrating a thin-film transistor array according to the embodiment of the invention. FIG. 11(a) is a schematic diagram illustrating one pixel (S1 region) of the thin-film transistor array illustrated in FIG. 10. FIG. 11(b) is a schematic diagram illustrating the gate line 22, the capacitor electrode 23, the capacitor line 24, a thin-film transistor region S2, and a pixel electrode region S3 illustrated in FIG. 11(a). FIG. 11(c) is a schematic sectional view taken on a line e-f illustrated in FIG. 11(a). As illustrated in FIGS. 10 and 11, in the thin-film transistor array according to the embodiment of the invention, the thin-film transistors are disposed in the matrix array, and each thin-film transistor includes the gate electrode 21 that is formed on the substrate 10, the gate insulating layer 11 that is formed on the gate electrode 21, the source electrode 27 that is formed on the gate insulating layer 11, the pixel electrode 25 that is formed on the gate insulating layer 11, the drain electrode 26 that is connected to the pixel electrode 25, and the semiconductor layer 12 that is formed between the source electrode 27 and the drain electrode 26. The gate line 22 doubles as the gate line 21, and the source electrode 27 is connected to the source line 28. The drain electrode 26 is formed within the region of the gate line 22.

In the second embodiment of the invention, the drain electrode 26 and the source electrode 27 are formed such that the thin-film transistor is disposed in the gate line 22, so that the thin-film transistor including the channel can be formed in the source line region 28A. Therefore, because the region of the pixel electrode 25 connected to the drain electrode 26 can be widely ensured, the high-aperture-ratio thin-film transistor array can be fabricated.

In the thin-film transistor array according to the second embodiment of the invention illustrated in FIGS. 10 and 11, the drain electrode 26 is formed on the substantial center line within the region of the gate line 22, and the source electrode 27 is formed so as to substantially surround the drain electrode 26. The connection electrode 25A connected to the pixel electrode 25 is connected to the substantial center of the drain electrode 26. Although the drain electrode 26 is illustrated as the rectangle, both ends of the drain electrode 26 may be rounded. Therefore, the thin-film transistor can be formed within the region of the gate line 22, and the gate line 22 can be maintained relatively thin.

Figure 12E:
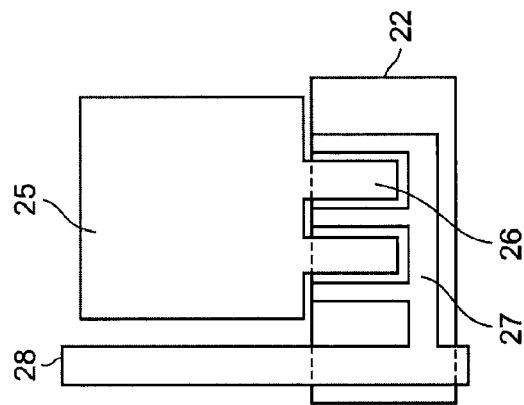
FIG. 12 is a schematic diagram illustrating a configuration example of a source electrode and a drain electrode of a thin-film transistor array according to an embodiment of the invention.
Figure 12C:
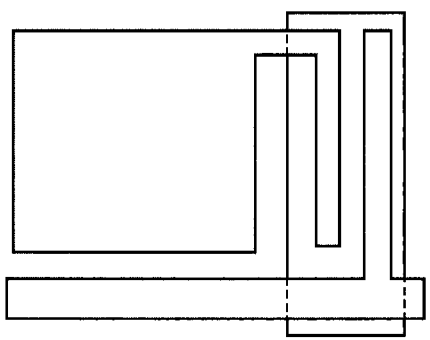
Figure 12D:
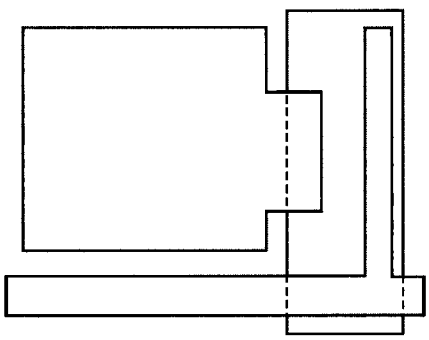
Figure 12A:
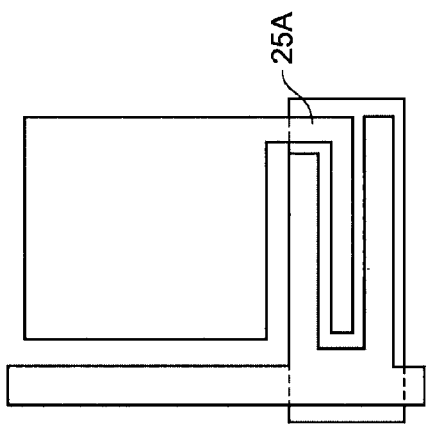

FIGS. 12(a) to 12(e) illustrate other configuration examples of the source electrode equivalent region 28B and the drain electrode 26 of the thin-film transistor array according to the second embodiment of the invention. In FIGS. 12(a) to 12(e), other constituents except the source electrode, the source line 28, the drain electrode 26, the pixel electrode 25, the connection electrode 25A, the gate electrode 21, and the gate line 22 for one pixel are omitted. In FIG. 11(a), the connection electrode 25A has the T-shape in which the connection electrode 25A is connected to the substantial center of the drain electrode 26. Alternatively, as illustrated in FIG. 12(a), the connection electrode 25A may have the L-shape in which the connection electrode 25A is connected to the end portion of the drain electrode 26. This L-shape can increase the channel width while reducing the overlapping between the gate electrode 21 and the drain electrode 26, the connection electrode 25A, and the pixel electrode 25.

Figure 12B:
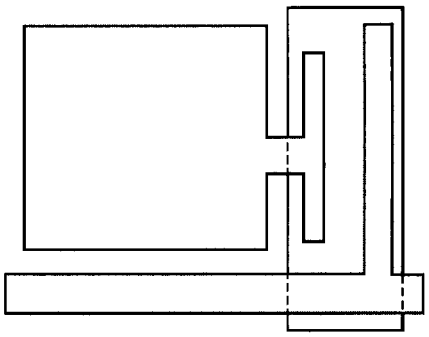

As illustrated in FIG. 12(b), the source electrode 27 is linearly connected so as to be orthogonal to the source line 28, and the drain electrode 26 may have the shape in which the drain electrode 26 is opposite the source electrode 27 with the substantial center line within the region of the gate line 22 as the gap. The configuration of FIG. 12(b) differs from the configuration of FIG. 11(a) in that the drain electrode 26 is not surrounded by the source electrode 27. The connection electrode 25A connected to the pixel electrode 25 is connected to the substantial center of the drain electrode 26. Although the drain electrode 26 is illustrated as the rectangle, both ends of the drain electrode 26 may be rounded. Therefore, the thin-film transistor can be formed within the region of the gate line 22, and the gate line 22 can be maintained relatively thin. In FIG. 12(a), the connection electrode 25A has the T-shape in which the connection electrode 25A is connected to the substantial center of the drain electrode 26. Alternatively, as illustrated in FIG. 12(c), the connection electrode 25A may have the L-shape in which the connection electrode 25A is connected to the end portion of the drain electrode 26. Because this L-shape can reduce the overlapping between the gate electrode 21 and the drain electrode 26, the connection electrode 25A, and the pixel electrode 25, the aperture ratio of the pixel can be increased and the shape of the gate electrode is simple and easy to make.

As illustrated in FIG. 12(d), the rectangular drain electrode 26 may have the shape in which the drain electrode 26 is opposite the linear source electrode 27 with the substantial center line within the region of the gate line 22 as the gap. The configuration of FIG. 12(d) corresponds to the case in which the width of the connection electrode 25A of FIG. 12(b) is equal to a length of the drain electrode 26. As used herein, the width of the connection electrode 25A means a width in a horizontal direction (a direction orthogonal to a direction connecting the drain electrode 26 and the pixel electrode 25) of the connection electrode 25A in FIG. 12(d), and the length of the drain electrode 26 means a width in a horizontal direction of the drain electrode in FIG. 12(d). Although this shape of has the slightly large overlapping between the gate electrode 21 and the drain electrode 26 and the pixel electrode 25, the shapes of the source electrode 27, the drain electrode 26, and the connection electrode 25A are simple and easy to make.

As illustrated in FIG. 12(e), the thin-film transistor array according to the embodiment of the invention may be formed into the comb shape in which the drain electrode 26 reaches the substantial center line within the region of the gate line 22. Although each tooth of the comb-shaped drain electrode 26 is illustrated as the rectangle, a leading end of the drain electrode 26 may be rounded. Therefore, the channel width can be increased by increasing the number of teeth of the comb-shaped drain electrode.

In the thin-film transistor array according to the second embodiment of the invention, it is necessary that at least the channel region where the source electrode 27 is opposite the drain electrode 26 be covered with the semiconductor layer 12, and it is necessary that the pattern of the semiconductor layer 12 be formed so as not to be in contact with the pixel electrode 25. Accordingly, in the thin-film transistor array according to the second embodiment of the invention in which the channel is formed in the gate line 22, desirably the semiconductor layer 12 is formed into the linear shape along the substantial center line of the gate line 22.

Figure 13:
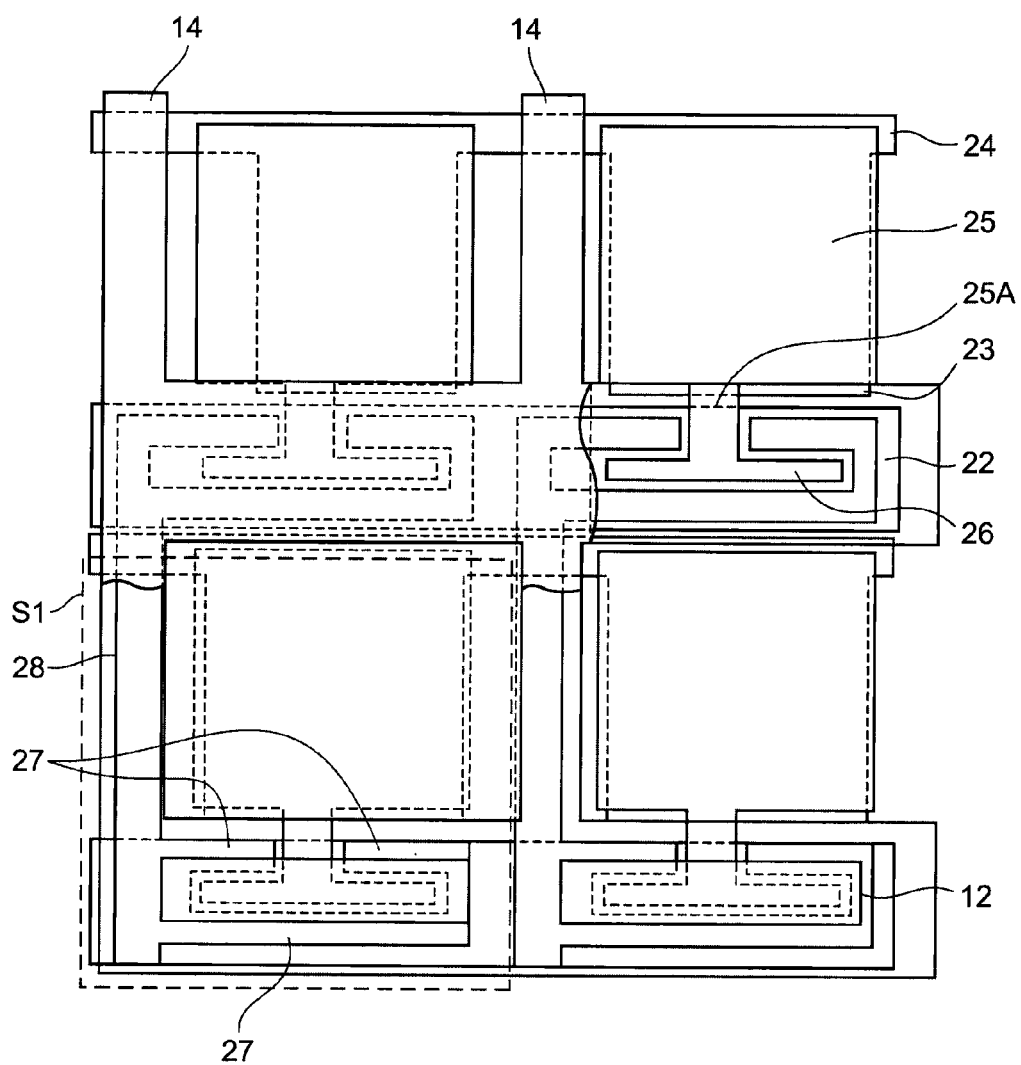
FIG. 13 is a schematic diagram illustrating an example of a thin-film transistor array according to an embodiment of the invention.

In the case that the channel is formed in the gate line region, the thin-film transistor can be operated even if the semiconductor layer 12 is formed into the stripe shape that is parallel to the gate line 22 and continuously formed in the plural pixels as illustrated in FIG. 13. However, desirably a current passed between the source lines can be suppressed when the pixels are separated from one another as illustrated in FIG. 10.

In the embodiment of the invention, similarly to the first embodiment, desirably the thin-film transistor array includes the capacitor electrode 23 in the same layer as the gate electrode 21. Therefore, the charges can be stably retained without relying solely on the capacitance of the display medium, and the image display device is effectively driven. As illustrated in FIG. 11(b), the capacitor line 24 is formed in parallel to the gate line 22, and the capacitor electrode 23 is connected to the capacitor line 24. The thin-film transistor region S2 is disposed so as to overlap the gate line, and the capacitor electrode 23 is disposed as to as overlap the pixel electrode region S3. Similarly to the first embodiment of the invention illustrated in FIG. 5(b), the capacitor electrode may be connected to the gate line of the adjacent row.

Figure 14A:
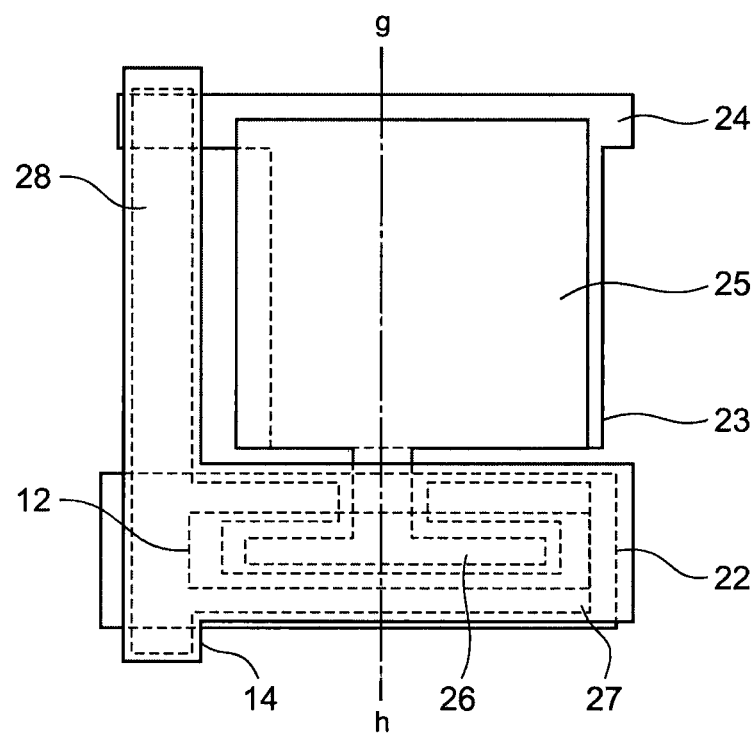
FIG. 14(a) is a schematic diagram illustrating one pixel of the thin-film transistor array illustrated in FIG. 13.
Figure 14B:
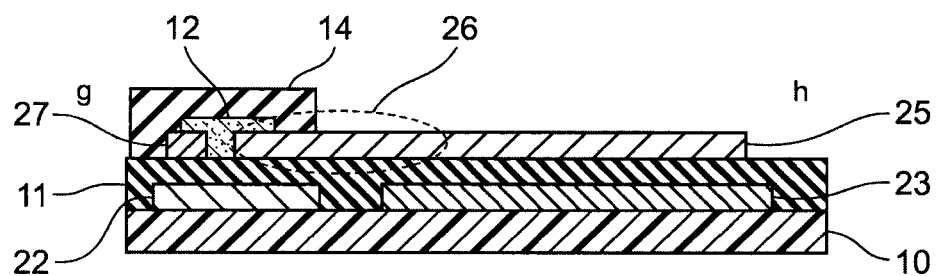
FIG. 14(b) is a schematic sectional view taken on a line g-h illustrated in FIG. 14(a).

FIG. 13 is a schematic diagram illustrating an example of the thin-film transistor array according to the second embodiment of the invention. FIG. 14(a) is a schematic diagram illustrating one pixel (S1) of the thin-film transistor array illustrated in FIG. 13, and FIG. 14(b) is a schematic sectional view taken on a line g-h illustrated in FIG. 14(a). As illustrated in FIG. 14, in the thin-film transistor array according to the embodiment of the invention, desirably the grid-like insulating film 14 is formed such that the source line 28 and the gate line 22 are covered therewith. In FIG. 14, the source line 28 and the gate line 22 are covered with the grid-like insulating film 14, and the semiconductor layer 12 is also inevitably covered. Therefore, the degradation of the semiconductor layer 12 can be prevented, and the influences of the voltages at the source line 28 and the gate line 22 can be suppressed in the case that the image display device is driven.

Figure 28:
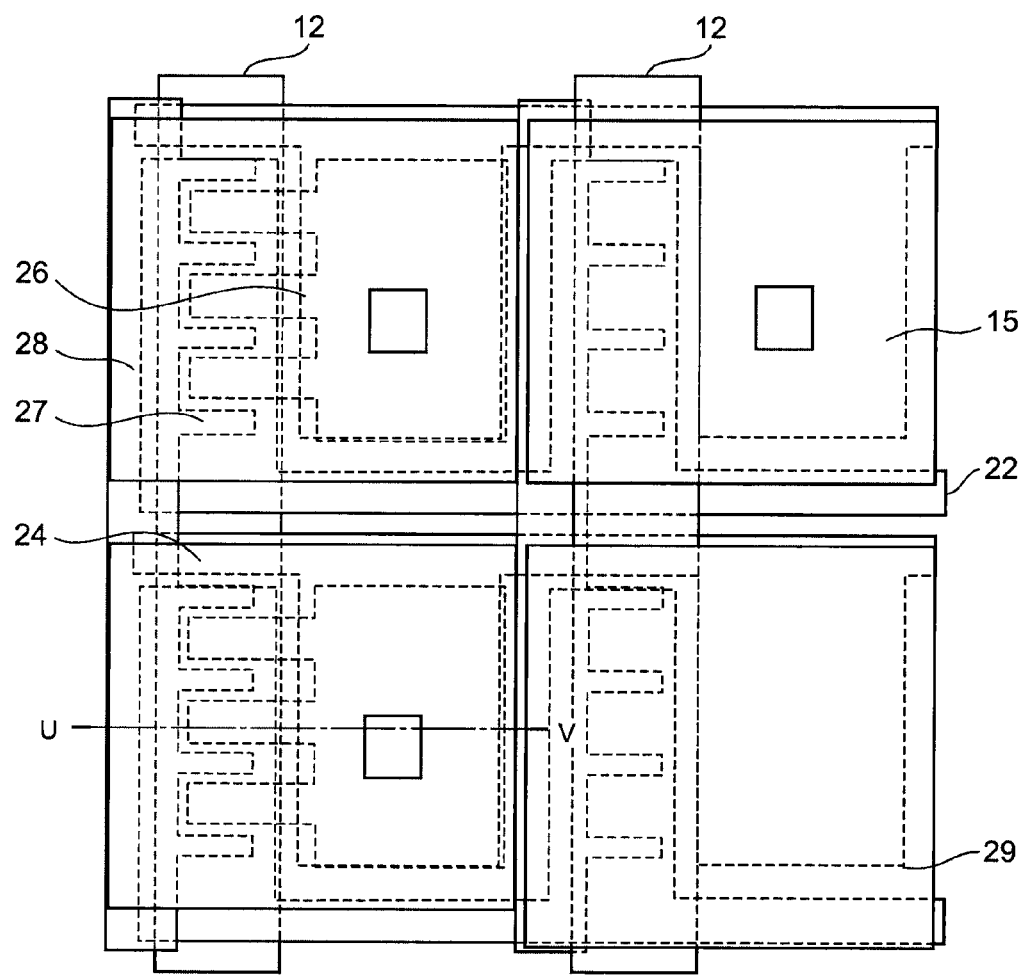
FIG. 28 is a schematic diagram illustrating an example of a conventional thin-film transistor.
Figure 29:
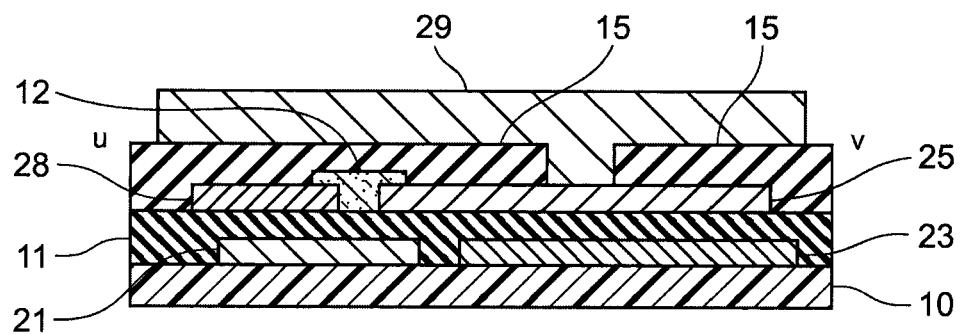
FIG. 29 is a schematic sectional diagram taken on a line u-v illustrated in FIG. 28.

On the other hand, in the case that the semiconductor layer 12 is formed out of region of the source line 28 or the gate line 22 as in the past, it is necessary that the semiconductor layer 12 out of the line region be also covered with the grid-like insulating film 14 as illustrated in FIGS. 28 and 29. In this case, because of the small aperture ratio, it is necessary to form the upper pixel electrode.

Figure 15:
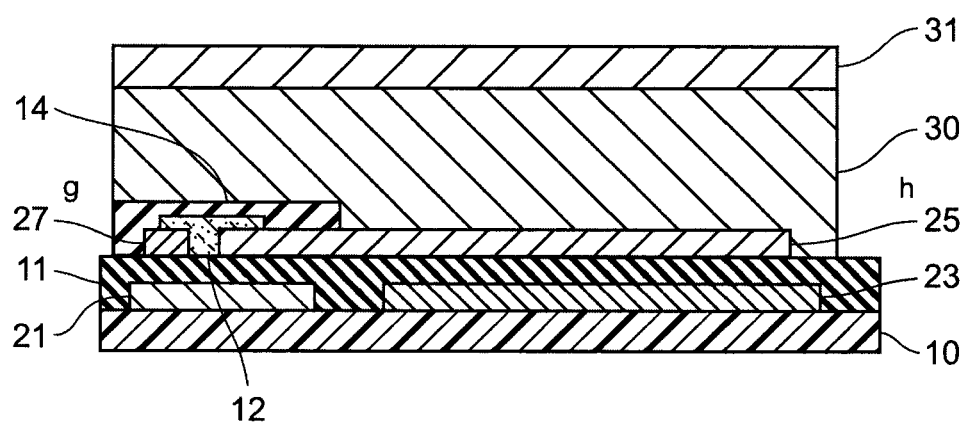
FIG. 15 is a schematic diagram illustrating an example of an image display device according to an embodiment of the invention.

FIG. 15 illustrates an example of an image display device in which the thin-film transistor array illustrated in FIGS. 13 and 14 is used. Referring to FIG. 15, the display medium 30 and the counter electrode 31 are disposed as the front plate on the thin-film transistor array. The display medium is sandwiched between the pixel electrode 26 and the counter electrode 31, and can be driven by applying the voltage between both the electrodes. There is no particular limitation to a kind of the display medium used in the front plate of the image display device of the invention. The electrophoretic display medium, the liquid crystal display medium, and the organic electroluminescence (EL) display medium can be used as the display medium. That is, image display devices such as the electrophoretic display, the liquid crystal display, and the organic electroluminescence (EL) display can be fabricated.

In the second embodiment of the invention, the thin-film transistor array according to the embodiment of the invention can be configured by any combination of the above constituents.

Next, materials used in the thin-film transistor array according to the embodiment of the invention will be described below. The following descriptions are applied to both the thin-film transistor array according to the first embodiment of the invention and the thin-film transistor array according to the second embodiment of the invention.

Not only the rigid substrate such as glass but also the flexible substrate can be used as the insulating substrate 10 of the thin-film transistor array according to the embodiment of the invention. For example, plastic materials such as a polyethylene terephthalate (PET), a polyimide, a polyether sulfone (PES), a polyethylene naphthalate (PEN), and a polycarbonate can be cited as the material generally used in the substrate. Glass substrates such as quartz and a silicon wafer can also be used as the insulating substrate. Among others, preferably the plastic substrate is used in consideration of the low-profile, the weight reduction, and the flexible substrate. In consideration of each process temperature, desirably the PEN or the polyimide is used as the substrate 10. The insulating substrate 10 may include a barrier layer or a planarizing layer.

There is no particular limitation to the material for the electrode (gate electrode 21, source electrode 27, and drain electrode 26) of the thin-film transistor array according to the embodiment of the invention. The following materials are generally used to make the electrode. That is, examples of the material include: a thin film made of the metal or the oxide, such as gold, silver, nickel, and an indium tin oxide; a conductive polymer such as poly (ethylendioxy tiophene)/polystyrene sulfonate (PEDOT/PSS) and a polyaniline; a solution in which metallic colloidal particles made of gold, silver, and nickel are dispersed; and a thick film paste in which metallic particles such as silver are used as the conductive material.

There is no particular limitation to the method for forming the electrode. For example, it is conceivable that the electrode is formed by dry deposition methods such as the vacuum evaporation method and the sputtering method. However, in consideration of the flexible substrate and the cost reduction, desirably the electrode is formed by wet deposition methods such as screen printing, reversal offset printing, flexography, and an inkjet method.

There is no particular limitation to the material for the gate insulating film 11 of the thin-film transistor array according to the embodiment of the invention. The following materials are generally used to make the gate insulating film 11. That is, examples of the material for the gate insulating film include: polymer solutions such as a polyvinyl phenol, a polymethylmethacrylate, a polyimide, a polyvinyl alcohol, and an epoxy resin; solutions in which particles such as aluminas and silica gels are dispersed; and inorganic materials such as a silicon oxide, a silicon nitride, a silicon oxynitride, an aluminum oxide, a tantalum oxide, a yttrium oxide, a hafnium oxide, a hafnium aluminate, a zirconia oxide, and a titanium oxide. Thin films made of the PET, the PEN, or the PES may be used as the gate insulating film 11. There is no particular limitation to the method for forming the gate insulating film 11. The dry methods such as the vacuum evaporation method, the sputtering method, and CVD, the wet method such as spin coating and slit die coating, and methods such as laminating can appropriately be used to form the gate insulating film 11.

There is no particular limitation to the material used as the semiconductor layer 12 of the thin-film transistor array according to the embodiment of the invention. Desirably organic semiconductor materials and oxide semiconductor materials are used for the purpose of the use of the flexible substrate.

Examples of the organic semiconductor materials include high-molecular organic semiconductor material such as a polythiophene, a polyallylamine, and a fluoren-bithiophene copolymer and derivatives thereof and low-molecular organic semiconductor material such as a pentacene, a tetracene, a copper phthalocyanine, and a perylene and derivatives thereof. Carbon compounds such as a carbon nanotube and a fullerene and a semiconductor nanoparticle dispersion liquid may be used as the material for the semiconductor layer 12. Well-known methods such as gravure printing, offset printing, screen printing, and an inkjet method can be adopted as the method for printing the organic semiconductor. Desirably the flexography, the reversal offset printing, the inkjet method, and the dispenser, which are suitable for a low-viscosity solution are used because the above organic semiconductors generally have low solubility to a solvent. Among others, the flexography is preferably adopted because of a short printing time and a small used amount of ink, and the flexography is suitable to the stripe printing. The stripe shape averages a film-thickness distribution caused by irregularity of an anilox roller in the stripe, and the film-thickness becomes constant, so that a TFT characteristic can be uniformed.

An oxide containing at least one element selected from zinc, indium, tin, tungsten, magnesium, and gallium can be cited as an example of the oxide semiconductor material. Well-known materials such as a zinc oxide, an indium oxide, an indium zinc oxide, a tin oxide, a tungsten oxide, and a zinc gallium indium oxide (In—Ga—Zn—O) can be cited as, but are not limited to, the oxide semiconductor material. Structures of the materials may be any one of a single crystal, a polycrystal, a fine crystal, a mixed crystal of crystal/amorphous, a nanocrystal scattered amorphous, and an amorphous state. As to the method for forming the oxide semiconductor layer, after the film is deposited by the sputtering method, a pulse laser deposition method, the vacuum evaporation method, the CVD method, or a sol-gel method, the patter can be formed by the photolithographic method or a liftoff method.

There is no particular limitation to the material used as the stripe insulating film 13 or the grid-like insulating film 14. The following materials are generally used to make the stripe insulating film 13 or the grid-like insulating film 14. That is, examples of the materials include: polymer solutions such as the polyvinyl phenol, the polymethylmethacrylate, the polyimide, the polyvinyl alcohol, the epoxy resin, and a fluorine resin; solutions in which particles such as the aluminas and the silica gels are dispersed; and inorganic materials such as the silicon oxide, the silicon nitride, the silicon oxynitride, the aluminum oxide, the tantalum oxide, the yttrium oxide, the hafnium oxide, the hafnium aluminate, the zirconia oxide, and the titanium oxide. There is no particular limitation to the method for forming the insulating film. For example, but not limited to, after the film is deposited by the dry methods such as the vacuum evaporation method, the sputtering method, and the CVD, the pattern is formed by the methods such as the photolithographic method and the liftoff method, or the pattern is directly formed by the wet methods such as the screen printing, letterpress printing, and the inkjet method.

In the thin-film transistor array according to the embodiment of the invention, it is necessary that the source line 28 or the gate line 22 is maintained thin in order to retain the high aperture ratio. Therefore, the shapes illustrated in FIG. 2(a), FIG. 23, FIGS. 3(a) to 3(d), FIG. 11(a), and FIGS. 12(a) to 12(d) are preferably used. However, the comb shapes illustrated in FIG. 3(e) or FIG. 12(e) may be used in the case that the mobility is high in the longitudinal direction of the patter of the semiconductor layer 12. In the case that the mobility is particularly high, only one tooth of the comb may be used. The upper pixel electrode is eliminated in the thin-film transistor array according to the embodiments of the invention. However, the upper pixel electrode may be used as needed basis.

Hereinafter, the description is made based on examples.

Example 1

In Example 1, a method for fabricating the bottom-gate, bottom-contact type thin-film transistor array illustrated in FIGS. 1 and 2 is demonstrated. In the thin-film transistor array of Example 1, one pixel is 500 μm square, the line width is 25 μm, the channel length is 5 μm, and the channel width is 500 μm. In the thin-film transistor array illustrated in FIGS. 1 to 3, the drain electrode 26 is formed into the linear shape along the substantial center line of the source line region 28A. Therefore, scale sizes of the drawings are different from the actual thin-film transistor array.

A polyethylene naphthalate (PEN) film (product of Teijin Cu Pont Films Japan Ltd.) was prepared as the substrate 10. Then the PEN substrate 10 was printed with a nano silver ink (Nano Silver (product of Sumitomo Electric Industries, Ltd.): polyethylene glycol #200 (product of Sigma-Aldrich Co. LLC.)=8:1 (ratio by weight) by a reversal offset printing method, and baked at 180° C. for 1 hour to form the gate electrode 21, the gate line 22, the capacitor electrode 23, and the capacitor line 24.

Then, a polyimide (Neopulim: product of Mitsubishi Gas Chemical Co., Inc.) was applied by a slit die coater method such that whole surfaces of the gate electrode 21, the gate line 22, the capacitor electrode 23, and the capacitor line 24 were covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200(product of Sigma-Aldrich Co. LLC.)=8:1 (ratio by weight) by the reversal offset printing method, and dried at 180° C. for 1 hour to form the source electrode 27 doubling as the source line 28, the drain electrode 26, and the pixel electrode 25.

Then, a solution, in which Lisicon SP200 (product of Merck) was dissolved in a tetralin (product of Kanto Chemical Co., Inc.) so as to become 1.0 wt %, was used as a semiconductor material between the source line 28 doubling as the source electrode 27 and the drain electrode 26, which were formed separately from each other. A photosensitive resin letterpress was used as a flexographic plate, the semiconductor material was printed into a stripe shape by a flexographic method using a 150-line anilox roller, and the semiconductor material was dried at 100° C. for 60 minutes to form the semiconductor layer 12. As a result, the thin-film transistor array was fabricated at the aperture ratio of 75%.

Example 2

In Example 2, a method for fabricating the bottom-gate, bottom-contact type thin-film transistor array illustrated in FIGS. 10 and 11 is demonstrated. In the thin-film transistor array of Example 2, one pixel is 500 µm square, the line width is 25 µm, the channel length is 5 µm, and the channel width is 500 µm. In the thin-film transistor array illustrated in FIGS. 10 and 11, the drain electrode 26 is formed into the linear shape along the substantial center line of the source line region 28A. Therefore, scale sizes of the drawings are different from the actual thin-film transistor array.

A polyether sulfone (PES) was used as the substrate 10. Then the PES substrate 10 was printed with the nano silver ink (Nano Silver (product of Sumitomo Electric Industries, Ltd.): polyethylene glycol #200(product of Sigma-Aldrich Co. LLC.)=8:1 (ratio by weight) by the reversal offset printing method, and baked at 180° C. for 1 hour to form the gate electrode 21 doubling as the gate line 22, the capacitor electrode 23, and the capacitor line 24.

Then the polyimide (Neopulim: product of Mitsubishi Gas Chemical Co., Inc.) was applied by the slit die coater method such that the whole surfaces of the gate electrode 21 doubling as the gate line 22, the capacitor electrode 23, and the capacitor line 24 were covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200(product of Sigma-Aldrich Co. LLC.)=8:1 (ratio by weight) by the reversal offset printing method, and dried at 180° C. for 1 hour to form the source electrode 27, the source line 28, the drain electrode 26, and the pixel electrode 25.

Then the solution, in which Lisicon SP200 (product of Merck & Co., Inc.) was dissolved in the tetralin (product of Kanto Chemical Co., Inc.) so as to become 1.0 wt %, was used as the semiconductor material between the source electrode 27 and the drain electrode 26, which were formed separately from each other. The photosensitive resin letterpress was used as the flexographic plate, the semiconductor material was printed in a rectangular shape by the flexographic method using the 150-line anilox roller, and the semiconductor material was dried at 100° C. for 60 minutes to form the semiconductor layer 12. As a result, the thin-film transistor array was fabricated at the aperture ratio of 75%.

Example 3

Figure 16:
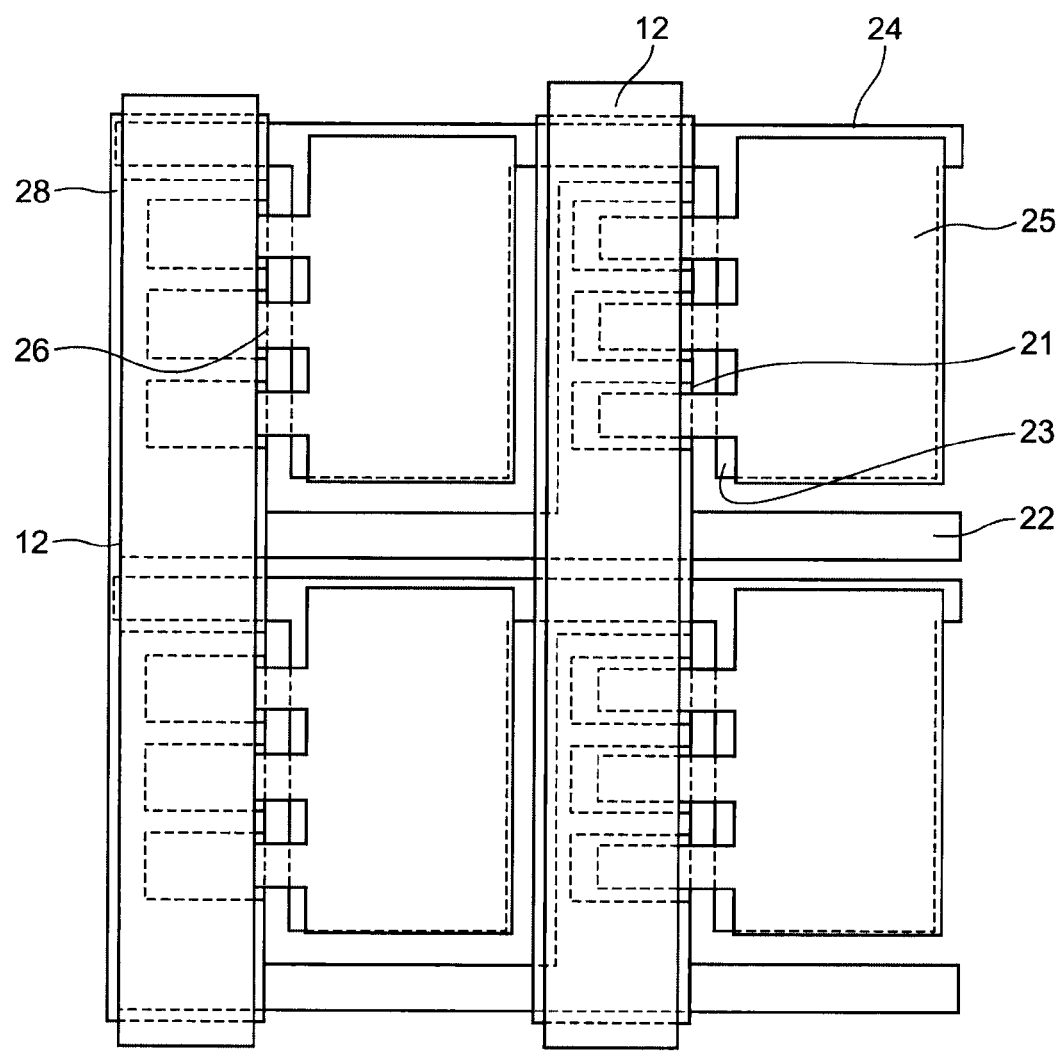
FIG. 16 is a schematic diagram illustrating an example of a thin-film transistor array according to an embodiment of the invention.

In Example 3, a method for fabricating a bottom-gate, bottom-contact type thin-film transistor array illustrated in FIGS. 16 and 17 is demonstrated. FIG. 16 is a schematic diagram illustrating the thin-film transistor array according to Example 3. FIG. 17(a) is a schematic diagram illustrating one pixel of the thin-film transistor array illustrated in FIG. 16 in a midstream production process, FIG. 17(b) is a schematic diagram illustrating the one pixel of the thin-film transistor array illustrated in FIG. 16, and FIG. 17(c) is a schematic sectional view taken on a line i-j illustrated in FIG. 17(b). In the thin-film transistor array of Example 3, one pixel is 500 µm square, each of the gate line 22 and the capacitor line 24 has the width of 25 µm, the source line 28 has the width of 35 µm, the channel length is 5 µm, and the channel width is 135 µm. In the thin-film transistor array illustrated in FIGS. 16 and 17, the drain electrode 26 is formed into the comb shape. Therefore, scale sizes of the drawings are different from the actual thin-film transistor array.

The PEN film (product of Teijin Du Pont Films Japan Ltd.) was prepared as the substrate 10. Then, the PEN substrate 10 was printed with the nano silver ink (Nano Silver (product of Sumitomo Electric Industries, Ltd.): polyethylene glycol #200 (product of Sigma-Aldrich Co. LLC.)=8:1 (ratio by weight) by a reversal offset printing method, and baked at 180° C. for 1 hour to form the gate electrode 21, the gate line 22, the capacitor electrode 23, and the capacitor line 24.

Then, a polyvinyl phenol (product of Sigma-Aldrich Co. LLC.) was applied with a thickness of 1 gm by the slit die coater method such that the whole surfaces of the gate electrode 21, the gate line 22, the capacitor electrode 23, and the capacitor line 24 were covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200(product of Sigma-Aldrich Co. LLC.)=8:1 (ratio by weight) by the reversal offset printing method, and dried at 180° C. for 1 hour to form the source electrode 27 doubling as the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source electrode 27 and the drain electrode 26, which were formed separately from each other. The photosensitive resin letterpress was used as the flexographic plate, the semiconductor material was printed into the stripe shape by the flexographic method using the 150-line anilox roller, and the semiconductor material was dried at 100° C. for 60 minutes to form the semiconductor layer 12. As a result, the thin-film transistor array was fabricated at the aperture ratio of 75%.

Example 4

Figure 18:
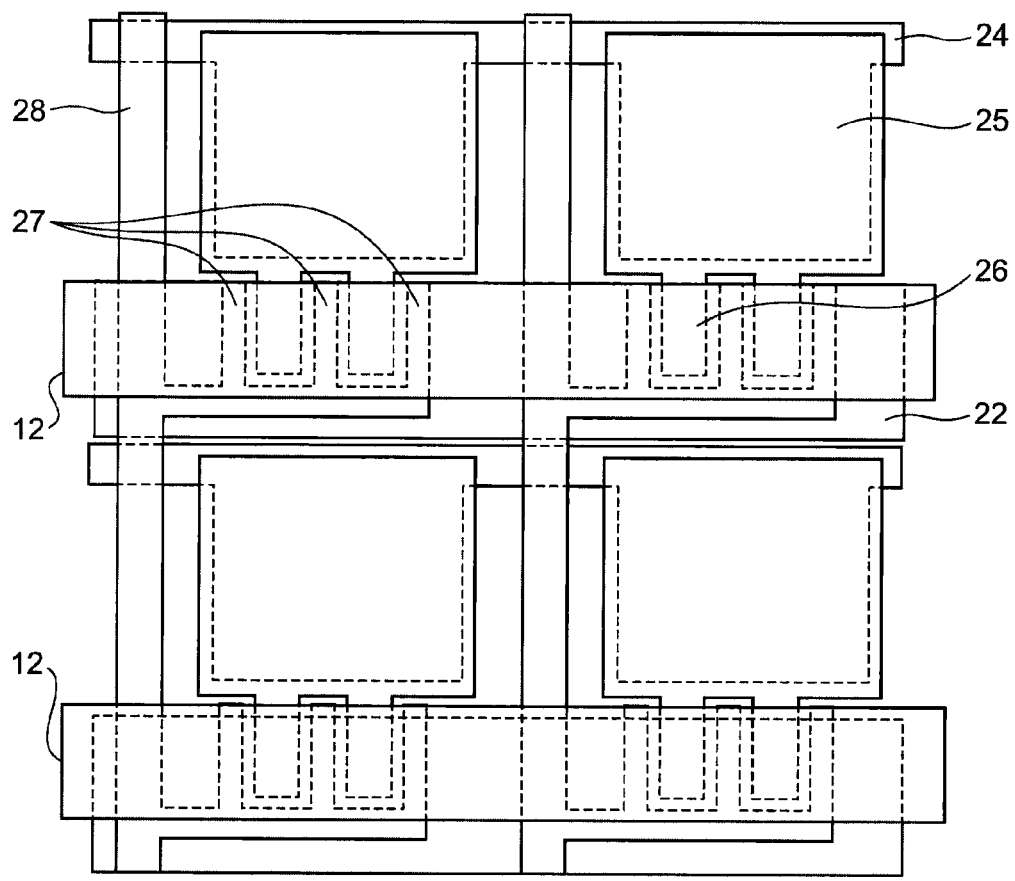
FIG. 18 is a schematic diagram illustrating an example of a thin-film transistor array according to an embodiment of the invention.

In Example 4, a method for fabricating a bottom-gate, bottom-contact type thin-film transistor array illustrated in FIGS. 18 and 19 is demonstrated. FIG. 18 is a schematic diagram illustrating the thin-film transistor array according to Example 4. FIG. 19(a) is a schematic diagram illustrating one pixel of the thin-film transistor array illustrated in FIG. 18 in a midstream production process, FIG. 19(b) is a schematic diagram illustrating one pixel of the thin-film transistor array illustrated in FIG. 18, and FIG. 19(c) is a schematic sectional view taken on a line k-l illustrated in FIG. 19(b). In the thin-film transistor array of Example 4, one pixel is 500 µm square, each of the source line 28 and the capacitor line 24 has the width of 25 µm, the gate line 22 has the width of 35 µm, the channel length is 5 µm, and the channel width is 135 µm. In the thin-film transistor array illustrated in FIGS. 18 and 19, the drain electrode 26 is formed into the comb shape. Therefore, scale sizes of the drawings are different from the actual thin-film transistor array.

The polyether sulfone (PES) was used as the substrate 10. Then, Al (aluminum) having the thickness of 50 nm was deposited on the PES substrate 10 by an evaporation method, and the gate electrode 21 doubling as the gate line 22, the capacitor electrode 23, and the capacitor line 24 were formed by a photolithographic method and an etching method.

Then, the gate insulating layer 11 having the thickness of 350 nm was formed by an RF magnetron sputtering method (atmosphere: Ar of 40 SCCM and oxygen of 0.2 SCCM) with a SiN sintered body as a target.

An ITO film having the thickness of 50 nm is deposited on the gate insulating layer 11 by a DC magnetron sputtering method, and the source electrode 27, the source line 28, the drain electrode 26, and the pixel electrode 25 were formed by the photolithographic method and the etching method.

Amorphous In—Ga—Zn—O having the thickness of 15 nm was deposited between the drain electrode 26 and the source line 28, which were formed separately from each other, by an RF sputtering method using an InGaZnO4 target. Then, the semiconductor layer 12 having the stripe pattern was formed by the photolithographic method and the etching method. As a result, the thin-film transistor array was fabricated at the aperture ratio of 75%.

Example 5

In Example 5, a method for fabricating a bottom-gate, bottom-contact type thin-film transistor array illustrated in FIGS. 6 and 7 is demonstrated. The design of the thin-film transistor array of Example 5 is similar to that of Example 1, and the stripe insulating film 13 is provided such that the source line 28 is covered therewith. The scale sizes of the drawings are different from the actual thin-film transistor array.

First, the PEN film (product of Teijin Du Pont Films Japan Ltd.) was used as the substrate 10. Then, the PEN substrate 10 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and baked at 180° C. for 1 hour to form the gate electrode 21, the gate line 22, the capacitor electrode 23, and the capacitor line 24.

Then, the polyvinyl phenol (product of Sigma-Aldrich Co. LLC.) was applied with the thickness of 1 µm by the slit die coater method such that the whole surfaces of the gate electrode 21, the gate line 22, the capacitor electrode 23, and the capacitor line 24 are covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and dried at 180° C. for 1 hour to form the source electrode 27 doubling as the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source electrode 27 and the drain electrode 26, which were formed separately from each other. The photosensitive resin letterpress was used as the flexographic plate, the semiconductor material was printed into the stripe shape by the flexographic method using the 150-line anilox roller, and the semiconductor material was dried at 100° C. for 60 minutes to form the semiconductor layer 12.

Then, the photosensitive resin letterpress was used as the flexographic plate, an insulating material (Cytop (product of Asahi Glass Co., Ltd.)) was printed into the stripe shape by the flexographic method using the 150-line anilox roller such that the semiconductor layer 12 and the source line 28 were covered therewith, and the insulating material was dried at 100° C. for 90 minutes to form the stripe insulating film 13. Therefore, the thin-film transistor array was fabricated at the aperture ratio of 75%. As a result of driving the thin-film transistor array with an electrophoretic medium interposed between the thin-film transistor array and the counter electrode, the high-aperture-ratio, good-contrast display was able to be obtained.

Example 6

Figure 20:
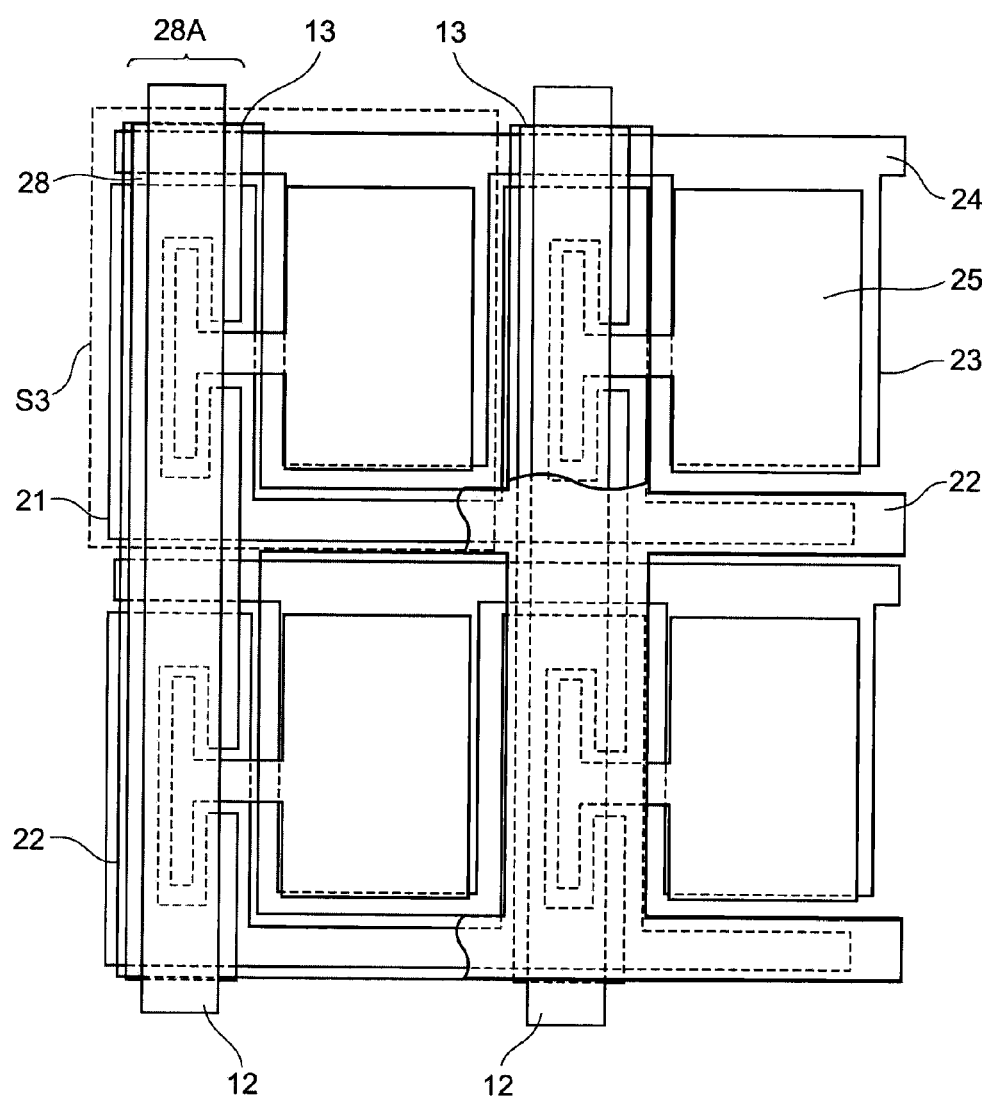
FIG. 20 is a schematic diagram illustrating an example of a thin-film transistor array according to an embodiment of the invention.
Figure 21A:
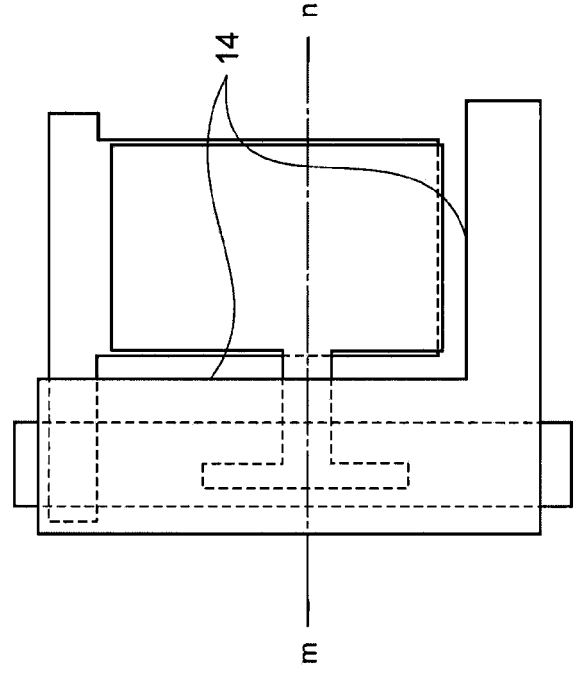
FIG. 21(a) is a schematic diagram illustrating one pixel of the thin-film transistor array illustrated in FIG. 20 in a midstream production process.
Figure 21B:
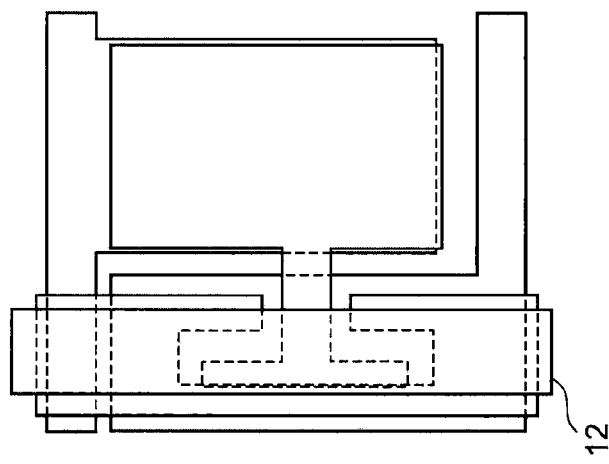
FIG. 21(b) is a schematic diagram illustrating the one pixel of the thin-film transistor array illustrated in FIG. 20.
Figure 21C:
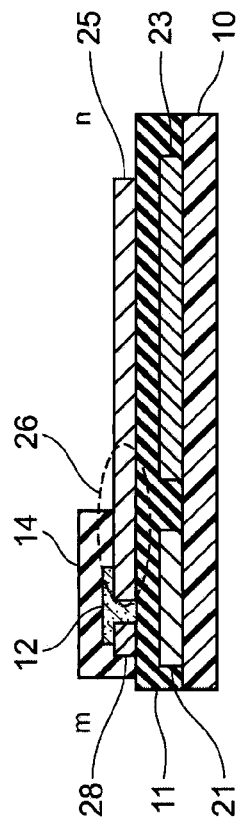
FIG. 21(c) is a schematic sectional view taken on a line m-n illustrated in FIG. 21(b).

In Example 6, a method for fabricating a bottom-gate, bottom-contact type thin-film transistor array illustrated in FIGS. 20 and 21 is demonstrated. FIG. 20 is a schematic diagram illustrating the thin-film transistor array according to Example 6. FIG. 21(a) is a schematic diagram illustrating one pixel of the thin-film transistor array illustrated in FIG. 20 in a midstream production process, FIG. 21(b) is a schematic diagram illustrating the one pixel of the thin-film transistor array illustrated in FIG. 20, and FIG. 21(c) is a schematic sectional view taken on a line m-n illustrated in FIG. 21(b). Design of the thin-film transistor array of Example 6 is similar to that of Example 1, and the grid-like insulating film 14 is provided such that the source line 28 and the drain line 22 are covered therewith. The scale sizes of the drawings are different from the actual thin-film transistor array.

First, the PEN film (product of Teijin Du Pont Films Japan Ltd.) was used as the substrate 10. Then, the PEN substrate 10 was printed with the nano silver ink (Nano Silver (product of Sumitomo Electric Industries, Ltd.): polyethylene glycol #200(product of Sigma-Aldrich Co. LLC.)=8:1 (ratio by weight) by a reversal offset printing method, and baked at 180° C. for 1 hour to form the gate electrode 21, the gate line 22, the capacitor electrode 23, and the capacitor line 24.

Then, the polyvinyl phenol (product of Sigma-Aldrich Co. LLC.) was applied with the thickness of 1 µm by the slit die coater method such that the whole surfaces of the gate electrode 21, the gate line 22, the capacitor electrode 23, and the capacitor line 24 are covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and dried at 180° C. for 1 hour to form the source electrode 27 doubling as the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source line 28 doubling as the source electrode 27 and the drain electrode 26, which were formed separately from each other. The photosensitive resin letterpress was used as the flexographic plate, the semiconductor material was printed into the stripe shape by the flexographic method using the 150-line anilox roller, and the semiconductor material was dried at 100° C. for 60 minutes to form the semiconductor layer 12.

Then, the insulating material (Cytop (product of Asahi Glass Co., Ltd.)) was printed by a screen printing method such that the semiconductor layer 12 was covered therewith, and the insulating material was dried at 100° C. for 90 minutes to form the grid-like insulating film 14. Therefore, the thin-film transistor array was fabricated at the aperture ratio of 75%. As a result of driving the thin-film transistor array with an electrophoretic medium interposed between the thin-film transistor array and the counter electrode, the high-aperture-ratio, good-contrast display was able to be obtained.

Example 7

Figure 22:
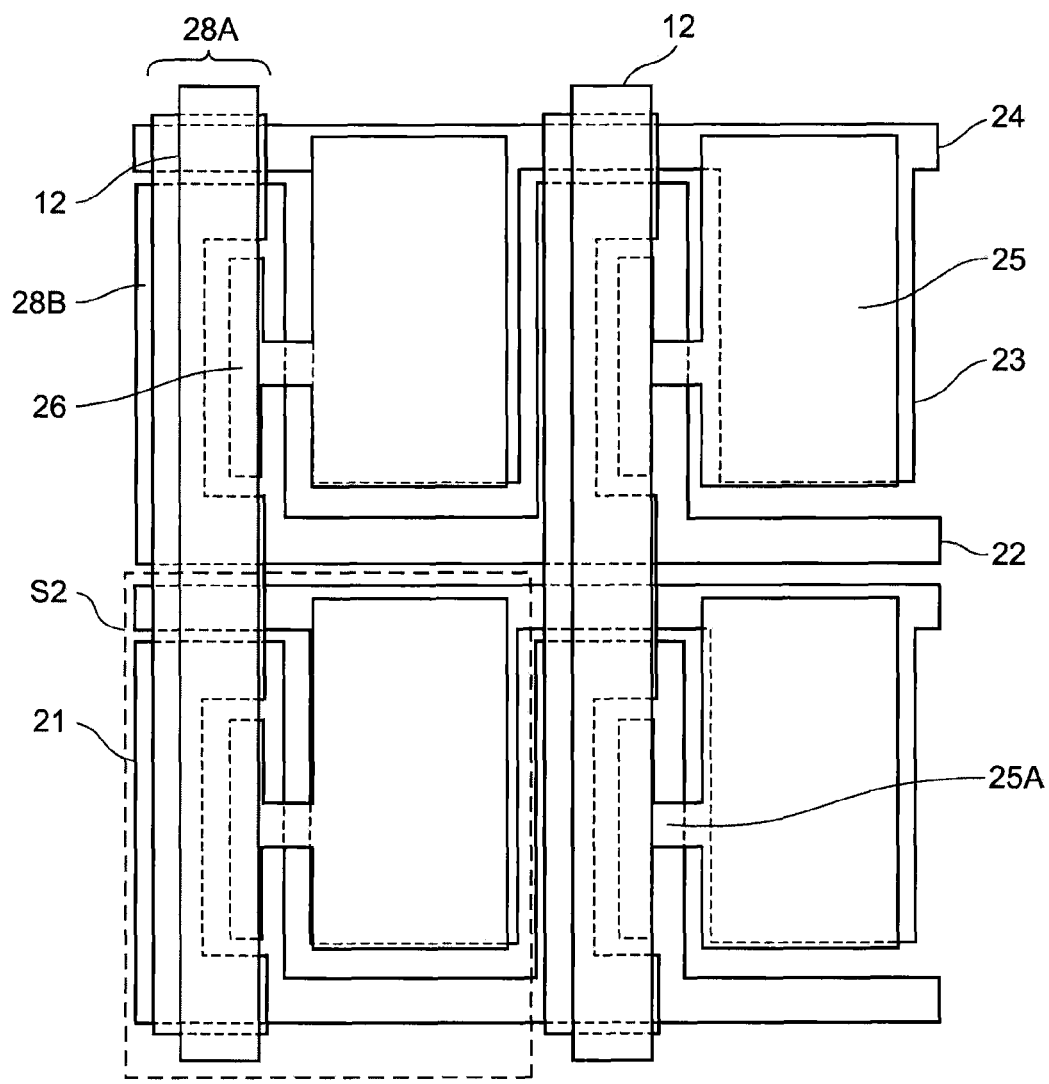
FIG. 22 is a schematic diagram illustrating an example of a thin-film transistor array according to an embodiment of the invention.

In Example 7, a method for fabricating a bottom-gate, bottom-contact type thin-film transistor array illustrated in FIGS. 22 and 23 is demonstrated. FIG. 22 is a schematic diagram illustrating the thin-film transistor array according to Example 7. FIG. 23(a) is a schematic diagram illustrating one pixel of the thin-film transistor array illustrated in FIG. 22 in a midstream production process, FIG. 23(b) is a schematic diagram illustrating the one pixel of the thin-film transistor array illustrated in FIG. 22, and FIG. 23(c) is a schematic sectional view taken on a line o-p illustrated in FIG. 23(b) In the thin-film transistor array of Example 7, one pixel is 500 μm square, the line width is 25 μm, the channel length is 5 μm, and the channel width is 300 μm. The thin-film transistor array illustrated in FIGS. 22 and 23 has the shape in which the drain electrode 26 is opposite the source electrode 27 with the substantial center line in the source line region 28A as the gap. The scale sizes of the drawings are different from the actual thin-film transistor array.

First, the polyethylene naphthalate (PEN) film (product of Teij in Du Pont Films Japan Ltd.) was prepared as the substrate 10. Then, the PEN substrate 10 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and baked at 180° C. for 1 hour to form the gate electrode 21, the gate line 22, the capacitor electrode 23, and the capacitor line 24.

Then, the polyimide (Neopulim: product of Mitsubishi Gas Chemical Co., Inc.) was applied by the slot die coater method such that the whole surfaces of the gate electrode 21, the gate line 22, the capacitor electrode 23, and the capacitor line 24 are covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and dried at 180° C. for 1 hour to form the source electrode 27 doubling as the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source line 28 doubling as the source electrode 27 and the drain electrode 26, which were formed separately from each other. The photosensitive resin letterpress was used as the flexographic plate, the semiconductor material was printed into the stripe shape by the flexographic method using the 150-line anilox roller, and the semiconductor material was dried at 100° C. for 60 minutes to form the semiconductor layer 12. As a result, the thin-film transistor array was fabricated at the aperture ratio of 75%.

Example 8

Figure 24:
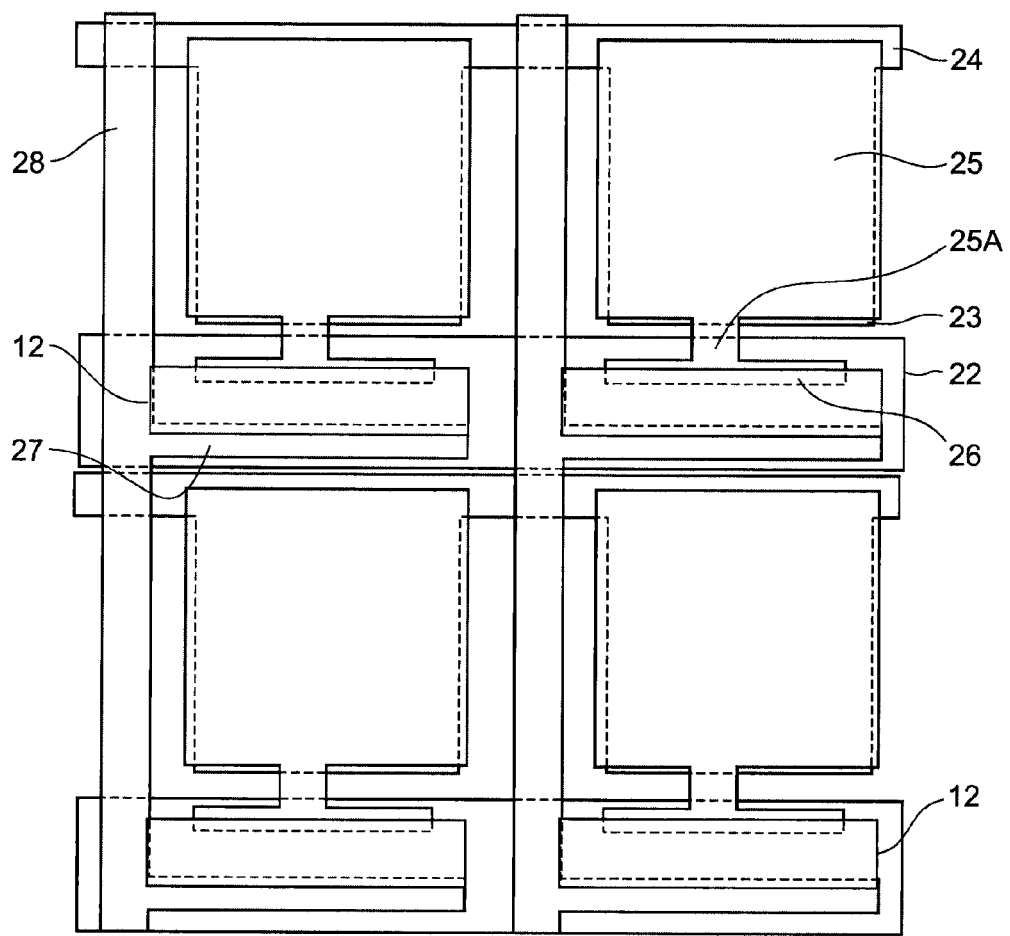
FIG. 24 is a schematic diagram illustrating an example of a thin-film transistor array according to an embodiment of the invention.

In Example 8, a method for fabricating a bottom-gate, bottom-contact type thin-film transistor array illustrated in FIG. 24 or 25 is demonstrated. FIG. 24 is a schematic diagram illustrating the thin-film transistor array according to Example 8. FIG. 25(a) is a schematic diagram illustrating one pixel of the thin-film transistor array illustrated in FIG. 24 in a midstream production process, FIG. 25(b) is a schematic diagram illustrating the one pixel of the thin-film transistor array illustrated in FIG. 24, and FIG. 25(c) is a schematic sectional view taken on a line q-r illustrated in FIG. 25(b). In the thin-film transistor array of Example 8, one pixel is 500 μm square, the line width is 25 μm, the channel length is 5 μm, and the channel width is 300 μm. The thin-film transistor array illustrated in FIGS. 24 and 25 has the shape in which the drain electrode 26 is opposite the source electrode 27 with the substantial centerline in the source line region 28 as the gap. The scale sizes of the drawings are different from the actual thin-film transistor array.

First, the polyether sulfone (PES) was used as the substrate 10. Then, the PES substrate 10 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and baked at 180° C. for 1 hour to form the gate electrode 21, the gate line 22, the capacitor electrode 23, and the capacitor line 24.

Then, the polyimide (Neopulim: product of Mitsubishi Gas Chemical Co., Inc.) was applied by the slot die coater method such that the whole surfaces of the gate electrode 21 doubling as the gate line 22, the capacitor electrode 23, and the capacitor line 24 were covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and dried at 180° C. for 1 hour to form the source electrode 27, the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source electrode 27 and the drain electrode 26, which were formed separately from each other. The photosensitive resin letterpress was used as the flexographic plate, the semiconductor material was printed into the rectangular shape by the flexographic method using the 150-line anilox roller, and the semiconductor material was dried at 100° C. for 60 minutes to form the semiconductor layer 12. As a result, the thin-film transistor array was fabricated at the aperture ratio of 75%.

Comparative Example 1

Figure 26:
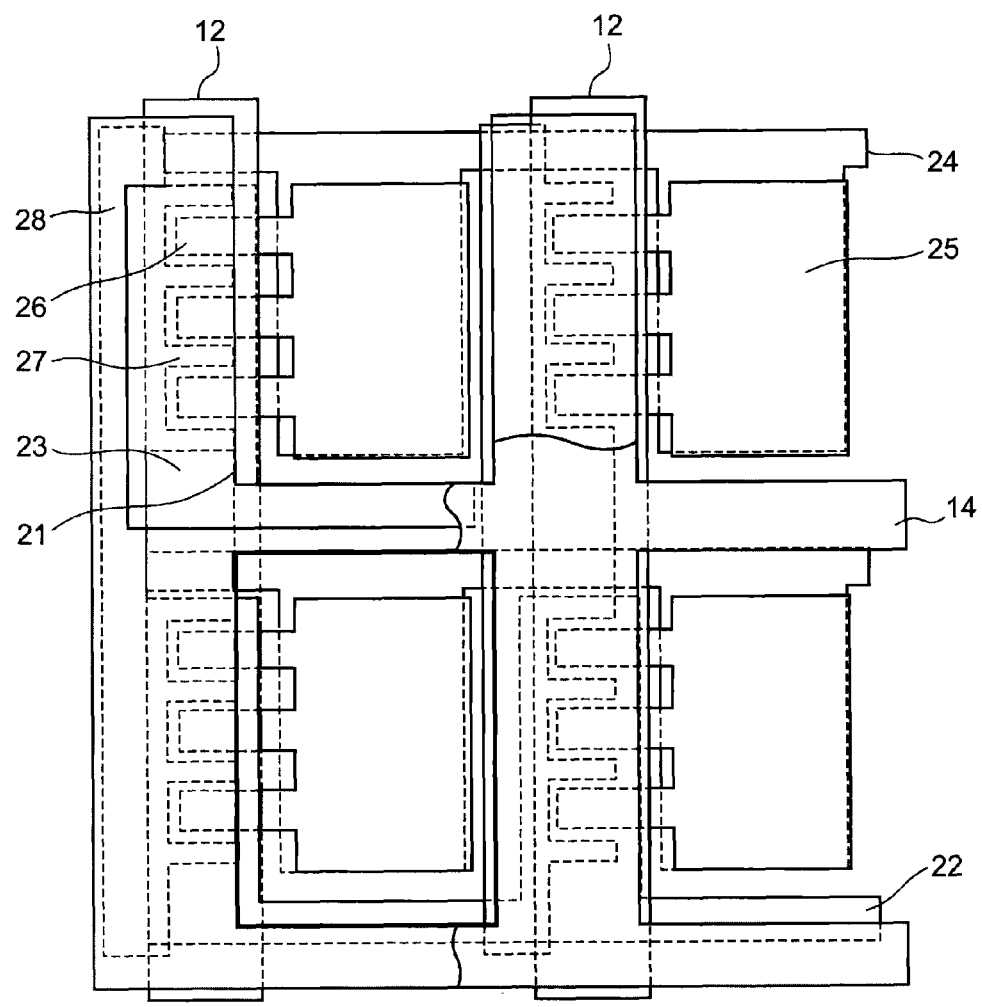
FIG. 26 is a schematic diagram illustrating an example of a conventional thin-film transistor array.

In Comparative Example 1, a method for fabricating a bottom-gate, bottom-contact type thin-film transistor array illustrated in FIGS. 26 and 27 is demonstrated. FIG. 26 is a schematic diagram illustrating the thin-film transistor array according to Comparative Example. FIG. 27(a) is a schematic diagram illustrating one pixel of the thin-film transistor array illustrated in FIG. 26 in a midstream production process, FIG. 27(b) is a schematic diagram illustrating the one pixel of the thin-film transistor array illustrated in FIG. 26, and FIG. 27(c) is a schematic sectional view taken on a line s-t illustrated in FIG. 27(b). In the thin-film transistor array of Comparative Example 1, one pixel is 500 μm square, the line width is 25 μm, the channel length is 5 μm, and the channel width is 500 μm, and the source electrode 27 and the drain electrode 26 are formed out of the source line 28. The scale sizes of the drawings are different from the actual thin-film transistor array.

First, the polyethylene naphthalate (PEN) film (product of Teij in Du Pont Films Japan Ltd.) was prepared as the substrate 10. Then, the PEN substrate 10 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and baked at 180° C. for 1 hour to form the gate electrode 21, the gate line 22, the capacitor electrode 23, and the capacitor line 24.

Then the polyimide (Neopulim: product of Mitsubishi Gas Chemical Co., Inc.) was applied by the slot die coater method such that the whole surfaces of the gate electrode 21, the gate line 22, the capacitor electrode 23, and the capacitor line 24 were covered therewith, and dried at 180° C. for 1 hour to form the gate insulating film 11.

Then, the gate insulating film 11 was printed with the nano silver ink (Nano Silver (product of Sumitomo Electric Industries, Ltd.): polyethylene glycol #200 (product of Sigma-Aldrich Co. LLC.)=8:1 (ratio by weight) by the reversal offset printing method, and dried at 180° C. for 1 hour to form the source electrode 27, the source line 28, the drain electrode 26, and the pixel electrode 25.

Then, the solution, in which Lisicon SP200 (product of Merck & Co., Inc.) was dissolved in the tetralin (product of Kanto Chemical Co., Inc.) so as to become 1.0 wt %, was used as the semiconductor material between the source electrode 27, the drain electrode 26, which were formed separately from each other. The photosensitive resin letterpress was used as the flexographic plate, the semiconductor material was printed into the stripe shape by the flexographic method using a 150-line anilox roller, and the semiconductor material was dried at 100° C. for 60 minutes to form the semiconductor layer 12.

Then, the grid-like insulating material 14(Cytop (product of Asahi Glass Co., Ltd.)) was printed by a screen printing method such that the semiconductor layer 12 was covered therewith, and the insulating material was dried at 100° C. for 90 minutes to form the grid-like insulating film 14. As a result, the aperture ratio becomes 64% that was smaller than that of Examples 1 to 6. As a result of driving the thin-film transistor array with the electrophoretic medium interposed between the thin-film transistor array and the counter electrode, the contrast display was degraded because of the low aperture ratio.

What is claimed is:

1. A thin-film transistor array,
wherein a thin-film transistor is disposed in a matrix array, the thin-film transistor including a gate electrode that is formed on a substrate, a gate insulating layer that is formed on the gate electrode, a source electrode that is formed on the gate insulating layer, a pixel electrode that is formed on the gate insulating layer, a drain electrode that is connected to the pixel electrode via a connection electrode, and a semiconductor layer that is formed between the source electrode and the drain electrode,
the gate electrode is connected to a gate line while the source electrode is connected to a source line,
the thin-film transistor is formed within a region of the source line and the thin-film transistor array includes a stripe insulating film that covers the source line and the semiconductor layer,
wherein the source line includes a notch in part thereof, the drain electrode is formed in the notch, and the source line doubles as the source electrode,
wherein the drain electrode has a linear shape along a substantial center line in the source line region, the linear shape has a long side and a short side, a direction of the long side is parallel to a direction of the source line, the source line is formed so as to double as the source electrode, and the source electrode has a shape in which the source electrode substantially surrounds the drain electrode,
wherein a combined body of the drain electrode and the connection electrode has a T-shape or an L-shape, and
wherein four sides of the drain electrode other than a connection part of the drain electrode and the connection electrode are surrounded by the notch of the source line, the four sides including a pair of the long sides and a pair of the short sides.

2. The thin-film transistor array according to claim 1, wherein the semiconductor layer has a linear shape along the substantial center line in the source line region.

3. The thin-film transistor array according to claim 2, wherein the semiconductor layer has a stripe shape in which the semiconductor layer is parallel to the source line and continuously formed in a plurality of pixels.

4. The thin-film transistor array according to claim 1, wherein the semiconductor layer is made of an organic semiconductor or an oxide semiconductor.

5. The thin-film transistor array according to claim 1, including a capacitor electrode in a layer where the gate electrode is formed.

6. An image display device, including the thin-film transistor array according to claim 1.

7. A thin-film transistor array,
wherein a thin-film transistor is disposed in a matrix array, the thin-film transistor including a gate electrode that is formed on a substrate, a gate insulating layer that is formed on the gate electrode, a source electrode that is formed on the gate insulating layer, a pixel electrode that is formed on the gate insulating layer, a drain electrode that is connected to the pixel electrode via a connection electrode, and a semiconductor layer that is formed between the source electrode and the drain electrode,
the gate electrode is connected to a gate line while the source electrode is connected to a source line,
the thin-film transistor is formed within a region of the source line and the thin-film transistor array includes a stripe insulating film that covers the source line and the semiconductor layer,
wherein the source line includes a notch in part thereof, the drain electrode is formed in the notch, and the source line doubles as the source electrode,
wherein the notch of the source line has a rectangular shape, and the drain electrode has a shape that corresponds with the rectangular shape of the notch, there being a gap between the source line and the drain electrode, the gap has mainly a linear shape parallel to a direction of the source line, the gap disposed at a substantial center line in the source line region, wherein a combined body of the drain electrode and the connection electrode has a T-shape or an L-shape, and wherein the rectangular shape includes four sides, and the four sides surround the drain electrode other than a connection part of the drain electrode and the connection electrode.

8. The thin-film transistor array according to claim 7, wherein the semiconductor layer has a linear shape along the substantial center line in the source line region.

9. The thin-film transistor array according to claim 8, wherein the semiconductor layer has a stripe shape in which the semiconductor layer is parallel to the source line and continuously formed in a plurality of pixels.

10. The thin-film transistor array according to claim 7, wherein the semiconductor layer is made of an organic semiconductor or an oxide semiconductor.

11. The thin-film transistor array according to claim 7, including a capacitor electrode in a layer where the gate electrode is formed.

12. An image display device, including the thin-film transistor array according to claim 7.

* * * * *